US009123864B2

(12) United States Patent
Tomonari et al.

(10) Patent No.: US 9,123,864 B2
(45) Date of Patent: Sep. 1, 2015

(54) SEMICONDUCTOR LIGHT-EMITTING ELEMENT

(71) Applicant: NICHIA CORPORATION, Anan-shi,Tokushima (JP)

(72) Inventors: Masakatsu Tomonari, Anan (JP); Toshiaki Ogawa, Anan (JP); Shunsuke Minato, Anan (JP)

(73) Assignee: NICHIA CORPORATION, Anan-Shi, Tokushima (JP)

( * ) Notice: Subject to any disclaimer, the term of this patent is extended or adjusted under 35 U.S.C. 154(b) by 35 days.

(21) Appl. No.: 14/072,359

(22) Filed: Nov. 5, 2013

(65) Prior Publication Data

US 2014/0124821 A1 May 8, 2014

(30) Foreign Application Priority Data

Nov. 6, 2012 (JP) ................................ 2012-244509

(51) Int. Cl.
*H01L 27/15* (2006.01)
*H01L 29/26* (2006.01)
(Continued)

(52) U.S. Cl.
CPC ............... *H01L 33/38* (2013.01); *H01L 21/022* (2013.01); *H01L 21/02304* (2013.01); *H01L 21/28247* (2013.01); *H01L 21/76841* (2013.01); *H01L 23/28* (2013.01); *H01L 23/53223* (2013.01); *H01L 23/53238* (2013.01); *H01L 23/53252* (2013.01); *H01L 23/53266* (2013.01); *H01L 24/26* (2013.01); *H01L 33/42* (2013.01); *H01L 33/44* (2013.01); *H01L 2224/022* (2013.01); *H01L 2224/8092* (2013.01); *H01L 2933/0016* (2013.01)

(58) Field of Classification Search
CPC . H01L 2933/0016; H01L 33/36; H01L 33/38; H01L 33/42; H01L 33/44; H01L 33/382; H01L 33/387; H01L 21/022; H01L 21/02304; H01L 21/76841; H01L 21/76802; H01L 21/76805; H01L 21/28247; H01L 23/53223; H01L 23/53238; H01L 23/53252; H01L 23/53266; H01L 23/5328; H01L 23/481; H01L 23/28; H01L 23/552; H01L 24/26; H01L 51/442; H01L 31/022466; H01L 2224/022; H01L 2224/8092
USPC ............... 257/79, 81, 99, 431, 432, 459, 753, 257/E23.16, E21.584, 774
See application file for complete search history.

(56) References Cited

U.S. PATENT DOCUMENTS 6,744,196 B1 * 6/2004 Jeon .............................. 313/498
8,569,735 B2 * 10/2013 Hiraiwa et al. ................. 257/13
(Continued)

FOREIGN PATENT DOCUMENTS

JP 2005-197289 A 7/2005
JP 2009-164423 A 7/2009
(Continued)

*Primary Examiner* — Teresa M Arroyo
(74) *Attorney, Agent, or Firm* — Squire Patton Boggs (US) LLP

(57) ABSTRACT

A semiconductor light-emitting element capable of increasing a strength of adhesion between an electrode and a protection film.

The semiconductor light-emitting element includes a semiconductor structure having an n-type semiconductor layer and a p-type semiconductor layer. A transparent conductive film is disposed on the p-type semiconductor layer. An insulation film is disposed on the transparent conductive film. A p-side electrode layer is disposed on the insulation film. A protection film is disposed over the insulation film, and the protection film covers part of the p-side electrode layer.

12 Claims, 17 Drawing Sheets

(51) Int. Cl.

| | |
|---|---|
| ***H01L 31/12*** | (2006.01) |
| ***H01L 33/00*** | (2010.01) |
| ***H01L 29/267*** | (2006.01) |
| ***H01L 27/14*** | (2006.01) |
| ***H01L 23/48*** | (2006.01) |
| ***H01L 23/52*** | (2006.01) |
| ***H01L 29/40*** | (2006.01) |
| ***H01L 33/38*** | (2010.01) |
| *H01L 21/02* | (2006.01) |
| *H01L 21/768* | (2006.01) |
| *H01L 21/28* | (2006.01) |
| *H01L 23/532* | (2006.01) |
| *H01L 23/28* | (2006.01) |
| *H01L 23/00* | (2006.01) |
| *H01L 33/42* | (2010.01) |
| *H01L 33/44* | (2010.01) |

(56) References Cited

U.S. PATENT DOCUMENTS

| | | | | |
|---|---|---|---|---|
| 2005/0194605 | A1* | 9/2005 | Shelton et al. | 257/99 |
| 2007/0176188 | A1* | 8/2007 | Tanaka et al. | 257/88 |
| 2012/0018765 | A1* | 1/2012 | Mizogami et al. | 257/99 |
| 2013/0285099 | A1* | 10/2013 | Hodota | 257/98 |
| 2014/0070714 | A1* | 3/2014 | Lee et al. | 315/186 |
| 2014/0312369 | A1* | 10/2014 | Yoon et al. | 257/96 |
| 2014/0319561 | A1* | 10/2014 | Lien et al. | 257/98 |

FOREIGN PATENT DOCUMENTS

| | | | |
|---|---|---|---|
| JP | 2011-119491 | A | 6/2011 |
| JP | 2011-138820 | A | 7/2011 |
| JP | 2012-019153 | A | 1/2012 |

* cited by examiner 1
2
3
4
5
6
7
8
11
12
20
21
22
23
26
31
32
33
40
41
42
51
52
61
62

1
51
32
26
12
6
5
4
3
40
20
2
21
32
40
20

1
2
3
4
5
6
12
20
21
22
26
32
33
40
51
52

SEMICONDUCTOR LIGHT-EMITTING ELEMENT

CROSS-REFERENCE TO RELATED APPLICATIONS

The present application claims priority under 35 U.S.C. §119 to Japanese Patent Application No. 2012-244509, filed Nov. 6, 2012. The contents of this application are incorporated herein by reference in their entirety.

BACKGROUND OF THE INVENTION

1. Field

The present invention relates to semiconductor light-emitting elements.

2. Description of the Related Art

The flip-chip mounting is a mounting method in which light is mainly extracted from a substrate side opposite to an electrode surface of a semiconductor light-emitting element. This mounting is also called face-down mounting. The structure of a semiconductor light-emitting element used in the face-down mounting includes both a p-pad electrode and an n-pad electrode on a surface opposite to an element substrate. The electrode surface is mounted on an external substrate. A metal bump is used for the face-down mounting, or an alloy is used as an adhesion layer. For example, JP2009-164423A discloses a semiconductor light-emitting element in which a bump is used to electrically connect the chip surface (electrode surface) and the external substrate. JP2009-164423A is described as follows: a transparent conductive film is stacked on a nitride semiconductor layer (p-type semiconductor layer); through holes are created in the transparent conductive film; a metal electrode layer at the outermost surface is extended in the through holes; this causes a contact member, which is part of the metal electrode layer, to directly contact the nitride semiconductor layer; and a strength of adhesion is thus increased.

The semiconductor light-emitting element disclosed in JP2009-164423A has a large distance (step) between the surface position of a p-pad electrode formed on the p-type semiconductor layer and the surface position of an n-pad electrode formed on an n-type semiconductor layer exposed by removing part of the p-type semiconductor layer. Thus, in order to bond the semiconductor light-emitting element to a sub-mount substrate and to make them level, it is necessary to adjust the height of an n-side bump and the height of a p-side bump.

Recently, various semiconductor light-emitting elements have been disclosed. They include, via an insulation film over a p-type semiconductor layer, an n-pad electrode electrically connected to an n-type semiconductor layer. They also include both a p-pad electrode and the n-pad electrode over the p-type semiconductor layer for their structural arrangement. The semiconductor light-emitting elements having such a structure can avoid the problem regarding a step between the p-pad electrode and the n-pad electrode, thereby improving characteristics of the face-down mounting. In addition, a contact region between the p- and n-pad electrodes and the mounting surface is made large. This also makes it possible to improve contact strength, precision, and heat dissipation characteristics.

SUMMARY

According to one embodiment of the present invention a semiconductor light-emitting element is provided. The semiconductor light-emitting element includes a semiconductor structure having a first semiconductor layer and a second semiconductor layer. The second semiconductor layer is disposed above the first semiconductor layer, and a transparent conductive film is disposed on the second semiconductor layer. An insulation film defines a first through hole and a second through hole, the first through hole and the second through hole exposing the transparent conductive film. The insulation film is disposed on the transparent conductive film. An electrode is disposed on the insulation film. The electrode is electrically connected to the transparent conductive film through the first through hole. A protection film is disposed over the insulation film. The protection film is in contact with the transparent conductive film through the second through hole, and the protection film covers part of the electrode.

According to another embodiment of the present invention, a semiconductor light-emitting element is provided. The semiconductor light-emitting element includes a semiconductor structure having an n-type semiconductor layer and a p-type semiconductor layer. The p-type semiconductor layer is disposed above the n-type semiconductor layer. A transparent conductive film is disposed on the p-type semiconductor layer. An insulation film defines a first through hole and a second through hole, the first through hole and the second through hole exposing the transparent conductive film. The insulation film is disposed on the transparent conductive film. A p-side electrode layer is disposed on the insulation film. The p-side electrode layer is electrically connected to the transparent conductive film through the first through hole. A protection film is disposed over the insulation film, and is in contact with the transparent conductive film through the second through hole, and the protection film is disposed over part of the p-side electrode layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
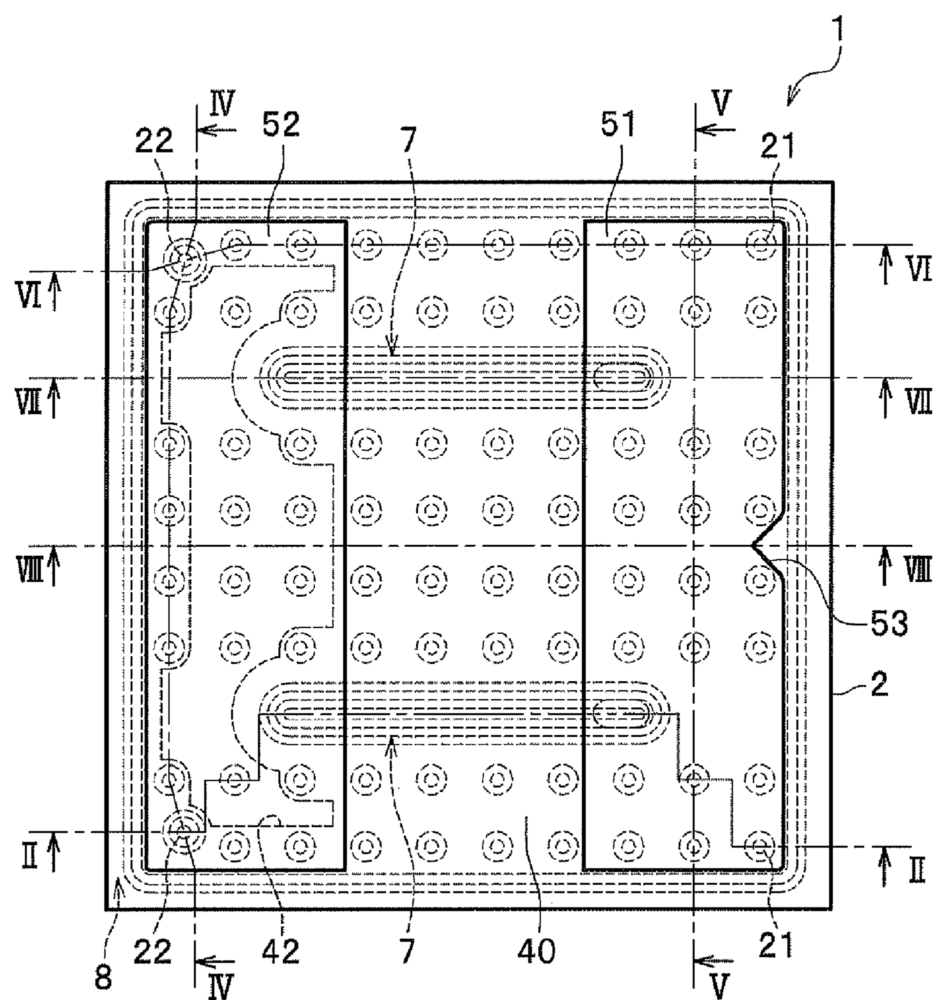
FIG. 1 is a top view seen from the electrode surface side and shows a semiconductor light-emitting element according to a first embodiment.

The following details semiconductor light-emitting elements according to embodiments of the present invention by referring to the drawings depicting several specific examples. Note that in some cases, the size and position, etc., of a member in each drawing is emphasized for clarity of the description. Further, in the following description, the same name and sign essentially denote the same or similar member so as to appropriately avoid redundancy.

According to one embodiment, a semiconductor light-emitting element includes a semiconductor structure having a first semiconductor layer and a second semiconductor layer, and the second semiconductor layer is disposed above the first semiconductor layer. The second semiconductor layer includes a transparent conductive film disposed thereon. The semiconductor light-emitting element also includes an insulation film defining a first through hole and a second through hole, where the first through hole and a second through hole exposes the transparent conductive film and the insulation film is disposed on the transparent conductive film. An electrode is disposed on the insulation film, and is electrically connected to the transparent conductive film through the first through hole. A protection film is disposed over the insulation film, and is in contact with the transparent conductive film through the second through hole. Further, the protection film covers part of the electrode.

According to such a configuration, the protection film which contacts the transparent conductive film through the second through hole functions as an anchor member for the transparent conductive film. In addition, the transparent conductive film which contacts the protection film through the second through hole prevents the protection film from detaching from the electrode. Here, the electrode disposed over the insulation film is made of, for example, metal or alloy. The transparent conductive film is made of, for example, a conductive oxide film. The protection film is made of, for example, an insulating oxide film. Thus, the protection film is more tightly attached to the transparent conductive film than to the electrode. Hence, such a configuration makes it possible to increase the strength of adhesion between the electrode and the protection film in the semiconductor light-emitting element.

In addition, a semiconductor light-emitting element according to an embodiment of the present invention is rectangular when seen from the electrode surface side. The second through hole can be disposed in a periphery portion of the semiconductor light-emitting element.

Here, the first through hole is electrically conductive. In the second through hole, however, no electrical current flows because the transparent conductive film contacts the protection film. Such a configuration makes it possible to prevent current diffusion in the semiconductor structure by arranging the non-conductive second through hole in the periphery portion or a corner of the rectangular semiconductor light-emitting element.

In addition, in a semiconductor light-emitting element according to an embodiment of the present invention, the second through hole can have an average diameter of greater than or equal to 5 μm and less than or equal to 15 μm.

Such a configuration makes it easy to produce the second through hole because the second through hole can have an average diameter of 5 μm or more in the semiconductor light-emitting element. In addition, because the second through hole can have an average diameter of 15 μm or less, current diffusion cannot be inhibited in the semiconductor structure.

A semiconductor light-emitting element according to an embodiment of the present invention can include a pad electrode disposed above the second semiconductor layer. The pad electrode is disposed on the protection film in the second through hole.

If the protection film is stacked at the outermost surface in the region having the second through hole, the protection film covering the second through hole repels a material used for joining to a mounting substrate during mounting of the element. As a result, the inside of the second through hole might have a hollow space. In a semiconductor light-emitting element according to an embodiment of the present invention, however, the pad electrode can be stacked on the protection film in the region having the second through hole. Consequently, the strength of the adhesion material is not repelled during mounting, so that the element can be stably mounted.

In addition, in a semiconductor light-emitting element according to an embodiment, it is preferable that the electrode is a second electrode and the pad electrode is a second pad electrode. The light-emitting element further includes a first electrode and a first pad electrode. The first electrode is disposed over the first semiconductor layer exposed without the second semiconductor layer, and the first pad electrode is disposed over the first electrode and electrically connected to the first electrode. The semiconductor structure is also covered with the insulation film between the first electrode and the second electrode, and the first pad electrode extends over the second electrode via the protection film.

In such a configuration of the semiconductor light-emitting element, a side edge between the surface of the first semiconductor layer without the second semiconductor layer and the surface of the second semiconductor layer is covered with the first pad electrode. Accordingly, light emitted by the semiconductor structure is reflected by the first pad electrode, so that the light can be efficiently extracted from the substrate side.

Further, in a semiconductor light-emitting element according to an embodiment of the present invention, the second through hole can be disposed only under the second pad electrode.

Furthermore, in a semiconductor light-emitting element according to an embodiment of the present invention, the insulation film can include a multilayer film.

Moreover, in a semiconductor light-emitting element according to an embodiment of the present invention, the insulation film can include a metal film embedded inside the multilayer film. Such a configuration makes it possible to reflect light from the semiconductor structure by using the insulation film, thereby efficiently extracting the light.

Semiconductor light-emitting elements according to embodiments of the present invention make it possible to increase the strength of adhesion between an electrode and a protection film. Because of the above, the semiconductor light-emitting elements enable a service life to be extended while keeping good light-extraction efficiency.

Figure 2:
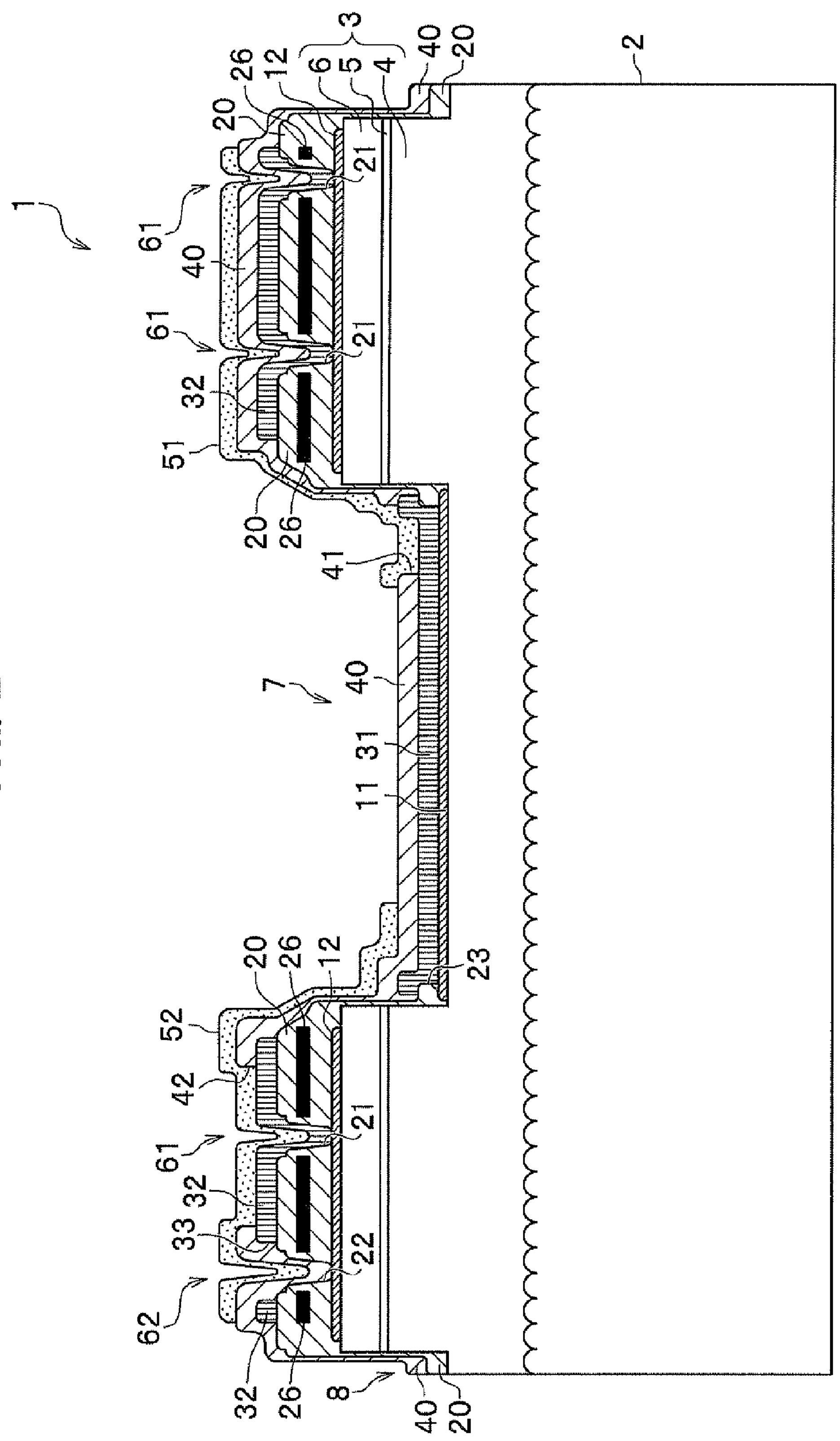
FIG. 2 is a schematic diagram showing a cross section taken along the II-II line in FIG. 1.
Figure 3:
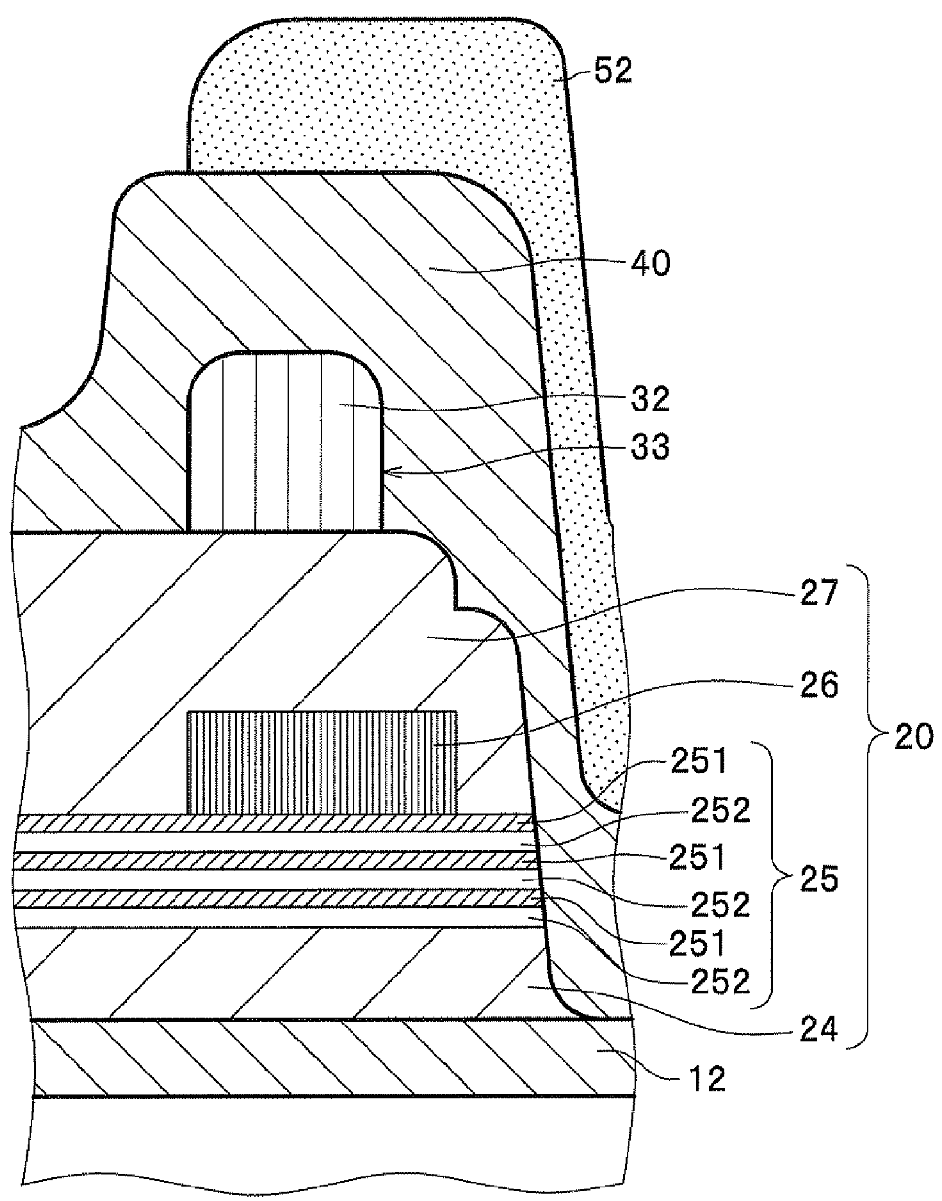
FIG. 3 is an enlarged view of part of FIG. 2.

With reference to FIGS. 1 to 3, the following provides an overview of the structure of a semiconductor light-emitting element 1 according to a first embodiment. Note that in FIGS. 2 to 8, areas denoted by reference signs 2, 4, 5, 6, and 252 are not marked with hatching for description clarity.

As illustrated in FIG. 1, the shape of the semiconductor light-emitting element 1 is rectangular when seen from the electrode surface side. This semiconductor light-emitting element 1 is an element that emits light from the substrate side and is subject to face-down mounting using an alloy as an adhesion layer. The semiconductor light-emitting element 1 includes an n-pad electrode (first pad electrode) 51 and a p-pad electrode (second pad electrode) 52 at the outermost surface (mounting surface) of the electrode surface side. The semiconductor light-emitting element 1 has a multi-step structure in which both the n-pad electrode 51 and the p-pad electrode 52 are arranged over a p-type semiconductor layer 6 (see FIG. 2). Note that in FIG. 1, for clear understanding, solid lines are used to illustrate the n-pad electrode 51 and the p-pad electrode 52 present in the forefront in a direction perpendicular to the paper and dashed lines are used to indicate areas denoted by reference signs 7, 8, 21, 22, etc. The areas denoted by these dashed lines can be visually inspected using a photomicrograph.

As illustrated in FIG. 2, the semiconductor light-emitting element 1 can include a substrate 2; a semiconductor structure 3, transparent conductive films 11 and 12; an insulation film 20; an n-side electrode layer (first electrode) 31; a p-side electrode layer (second electrode) 32; a protection film 40; an n-pad electrode 51; and a p-pad electrode 52.

As illustrated in FIG. 2, the semiconductor structure 3 is formed on the substrate 2, including, in sequence, an n-type semiconductor layer (first semiconductor layer) 4, an active layer 5, and a p-type semiconductor layer (second semiconductor layer) 6. The transparent conductive film 12 is disposed on the p-type semiconductor layer 6. The insulation film 20 is disposed on the transparent conductive film 12. The insulation film 20 includes first and second through holes 21 and 22 having the transparent conductive film 12 exposed. The p-side electrode layer 32 is disposed on the insulation film 20. The first through hole 21 is used to electrically connect the p-side electrode layer 32 and the transparent conductive film 12. The protection film 40 is disposed over the insulation film 20 with which part of the p-side electrode layer 32 is covered. The second through hole 22 is used to cause the protection film 40 to contact the transparent conductive film 12. The protection film 40 in contact with the transparent conductive film 12 via the second through hole 22 functions as an anchor member for the transparent conductive film 12.

As shown in FIG. 2, and an enlarged view in FIG. 3, this embodiment has an opening for anchor (through hole) 33 in the p-side electrode layer 32. The opening for anchor 33 is filled with the protection film 40. Accordingly, the opening for anchor 33 and the second through hole 22 are used to causing the protection film 40 to contact the transparent conductive film 12.

During the process of manufacturing the semiconductor light-emitting element 1, part of the semiconductor structure 3 is removed from the p-type semiconductor layer 6 side. In this manner, the semiconductor structure 3 has regions in which the n-type semiconductor layer 4 is exposed without the p-type semiconductor layer 6. The regions include; a concave region 7 surrounded by the p-type semiconductor layer 6; and a peripheral region 8 formed in the periphery of the semiconductor structure 3 (see FIG. 9). As illustrated in FIGS. 1 and 2, in this embodiment, the concave region 7 is a groove elongated along the VII-VII line shown in FIG. 1. In this instance, the center region of the semiconductor structure 3 has two concave regions 7 arranged with a distance in a short direction with respect to the concave region 7 (i.e., in a direction along the V-V line shown in FIG. 1). The n-type semiconductor layer 4 is used to form the bottom of the concave region 7. The n-type semiconductor layer 4, the active layer 5, and the p-type semiconductor layer 6 are used to form the side (inner periphery) of the concave region 7. The transparent conductive film 11 is disposed on the n-type semiconductor layer 4 of the concave region 7. The center portion of the bottom of the concave region 7 is coated with the transparent conductive film 11. Its peripheral region is coated with the insulation film 20. Also, the side (inner periphery) of the concave region 7 is coated with the insulation film 20. The peripheral region 8 is formed between a dicing line and the substantial light-emitting portion of the semiconductor structure 3. The n-type semiconductor layer 4 exposed in the peripheral region 8 is coated with the insulation film 20. The protection film 40 is stacked on the insulation film 20.

As illustrated in FIG. 2, the n-side electrode layer 31 and the p-side electrode layer 32 are disposed at the same surface side with respect to the substrate 2. The n-side electrode layer 31 is disposed over the n-type semiconductor layer 4 from which the p-type semiconductor layer 6 is removed. In this embodiment, the transparent conductive film 11 is interposed between the n-side electrode layer 31 and the n-type semiconductor layer 4.

As illustrated in FIG. 2, the n-pad electrode 51 is disposed over the n-side electrode layer 31. An n-side opening (through hole) 41 of the protection film 40 is used to electrically connect the n-pad electrode 51 and the n-side electrode layer 31. The n-pad electrode 51 extends via the protection film 40 over the p-side electrode layer 32. The insulation film 20 is disposed to cover the semiconductor structure 3 between the n-side electrode layer 31 and the p-side electrode layer 32.

The insulation film 20 is a multilayer film. The multilayer film of the insulation film 20 includes a metal film 26 over the transparent conductive film 12. In this embodiment, as illustrated in FIG. 3, the insulation film 20 includes, for example, from the transparent conductive film 12 side, a ground layer 24, a DBR (distribution Bragg reflector) 25, a metal film 26, and a cap layer 27. Note that the details of each layer will be described below.

As illustrated in FIG. 2, in the region having a first through hole 21 of the insulation film 20, the transparent conductive film 12 is in contact with the p-side electrode layer 32, so that electricity flows through the first through hole 21. Hence, hereinafter, this region is called a conductive portion 61.

As illustrated in the left side of FIG. 2, the p-pad electrode 52 is disposed above the p-type semiconductor layer 6. A p-side opening (through hole) 42 of the protection film 40 is used to electrically connect the p-pad electrode 52 and the p-side electrode layer 32. The p-pad electrode 52 is disposed on the protection film 40 in a second through hole 22. In the region having the second through hole 22 of the insulation film 20, the transparent conductive film 12 is in contact with the protection film 40, so that no electricity flows through the second through hole 22. Hence, hereinafter, this region is called a non-conductive portion 62.

As illustrated in FIG. 1, the second through hole 22 is disposed in the periphery portion of the semiconductor light-emitting element 1. That is, the second through hole 22 is disposed in the periphery of the element (i.e., just inside the outline of the element) when seen from the electrode surface side of the semiconductor light-emitting element 1. In this sense, as used herein, the term "the periphery portion of the element" may refer to a corner of the element or a region between corners of the element. FIG. 1 details that the second through holes 22 are arranged in corners of the rectangular semiconductor light-emitting element 1 when viewed from the electrode surface side. Because the non-conductive second through holes 22 are arranged in the corners, current diffusion cannot be inhibited in the semiconductor structure 3. As an example, the second through holes 22 are disposed under the p-pad electrode 52. The number of the second through holes 22 may be one or more. As an example, the two second through holes 22 are disposed.

The following details the first embodiment of the semiconductor light-emitting element 1 according to FIGS. 4 to 8.

Figure 4:
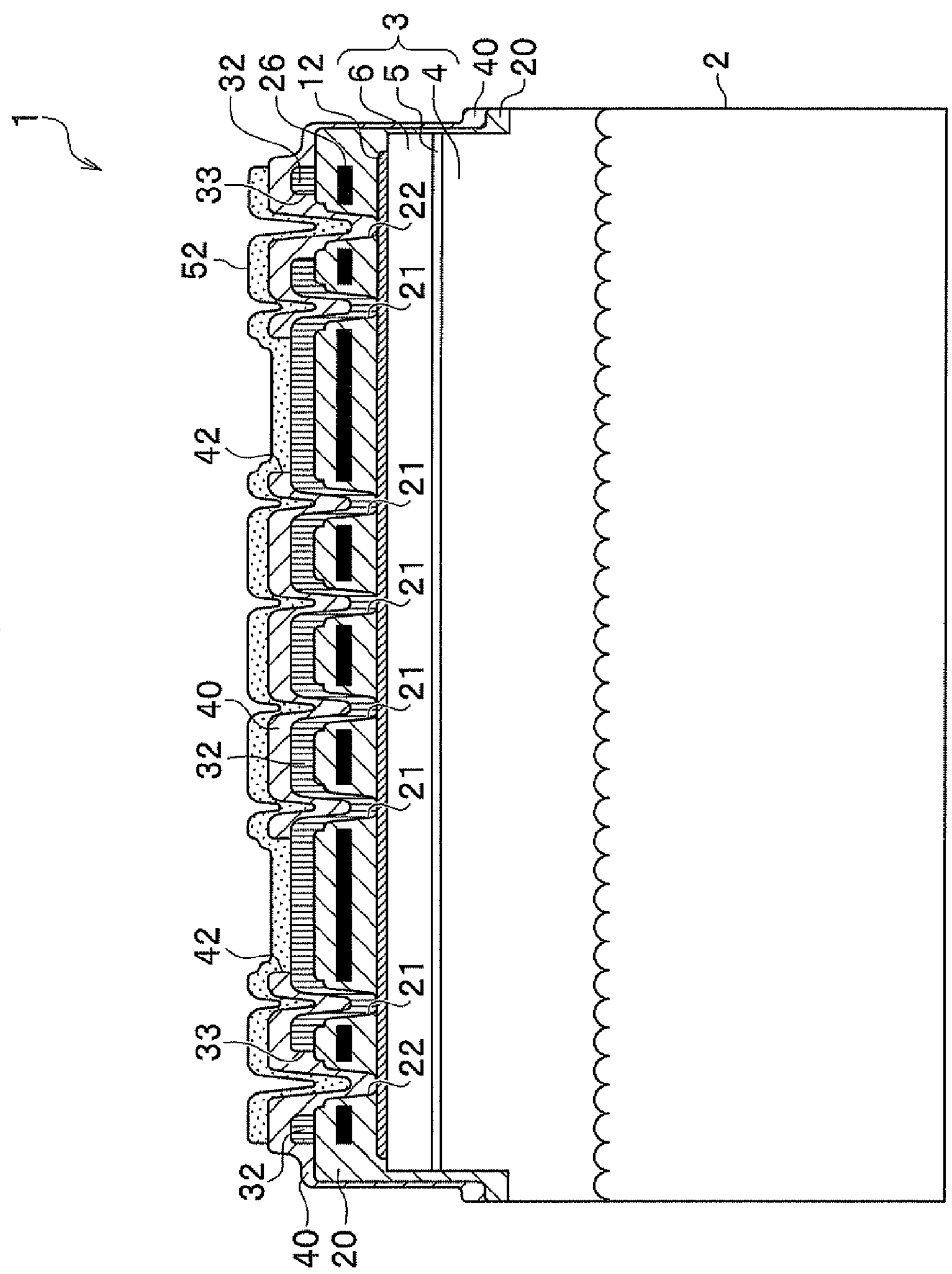
FIG. 4 is a schematic diagram showing a cross section taken along the IV-IV line in FIG. 1.

FIG. 4 is a schematic cross-sectional view taken along the IV-IV line in FIG. 1. As illustrated in FIG. 4, the p-pad electrode 52 is continuously distributed above the p-type semiconductor layer 6. The insulation film 20 is continuously formed over the periphery of the semiconductor structure 3 (i.e., the side and the upper surface of the n-type semiconductor layer 4), the transparent conductive film 12, and the region which is over the p-type semiconductor layer 6 but is not covered with the transparent conductive film 12. The transparent conductive film 12 has a plurality of openings.

Specifically, the stacked layer of the second through hole 22 includes, in sequence from the p-type semiconductor layer 6 side, the transparent conductive film 12, the protection film 40, and the p-pad electrode 52. That is, in the region having the second through hole 22 of the insulation film 20, the protection film 40 is used to insulate the transparent conductive film 12 from the p-pad electrode 52, which produces the non-conductive portion 62 (see FIG. 2).

In addition, the stacked layer of the first through hole 21 includes, in sequence from the p-type semiconductor layer 6 side, the transparent conductive film 12, the p-side electrode layer 32, the protection film 40, and the p-pad electrode 52. That is, the conductive portion 61 (see FIG. 2) keeps the insulation film 20 electrically penetrated in order that the p-side electrode layer 32 and the transparent conductive film 12 are made conductive therebetween.

As illustrated in FIG. 4, the p-side electrode layer 32 is continuously distributed above the p-type semiconductor layer 6 and disposed on the insulation film 20. In this regard, however, in the second through hole 22 of the insulation film 20, the protection film 40 is in contact with the transparent conductive film 12. Accordingly, an opening for anchor 33 penetrates through the p-side electrode layer 32.

The protection film 40 is continuously formed on the upper surface of the p-side electrode layer 32 and the region which is over the upper surface of the insulation film 20 but is not covered with the p-side electrode layer 32. The protection film 40 has an opening over the p-type semiconductor layer 6. Specifically, the protection film 40 has a through hole at a p-side opening 42 in order that the p-pad electrode 52 and the p-side electrode layer 32 are made conductive therebetween.

Figure 5:
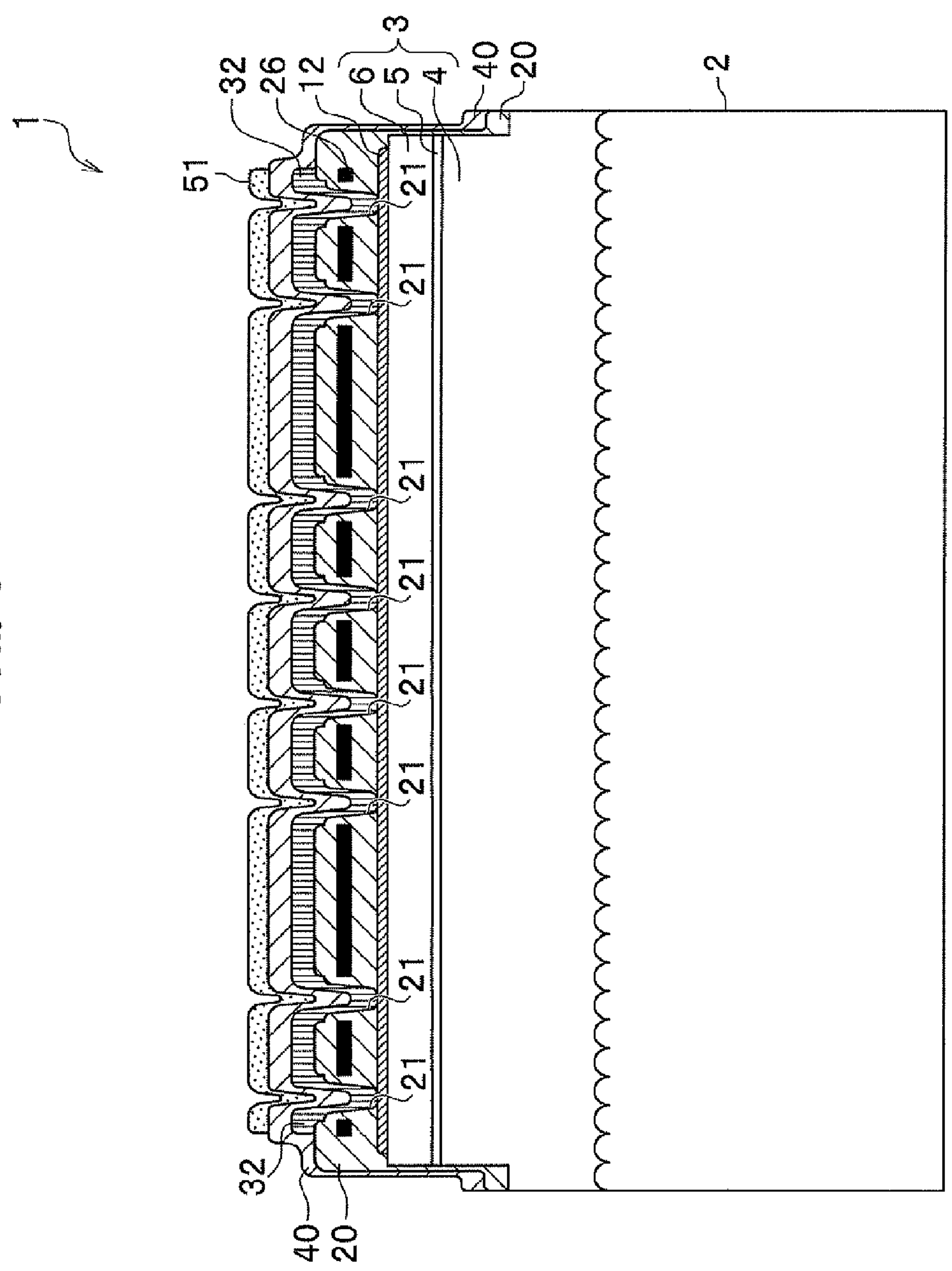
FIG. 5 is a schematic diagram showing a cross section taken along the V-V line in FIG. 1.

FIG. 5 is a schematic cross-sectional view taken along the V-V line in FIG. 1. As illustrated in FIG. 5, the n-pad electrode 51 is continuously distributed above the p-type semiconductor layer 6. The insulation film 20 has substantially the same stacking state as illustrated in FIG. 4. In this regard, however, no second through hole 22 is formed in the V-V cross section. The p-side electrode layer 32 has substantially the same stacking state as illustrated in FIG. 4. In this regard, however, no opening for anchor 33 is formed in the V-V cross section.

The protection film 40 is continuously formed on the upper surface of the p-side electrode layer 32 and the region which is over the upper surface of the insulation film 20 but is not covered with the p-side electrode layer 32.

Figure 6:
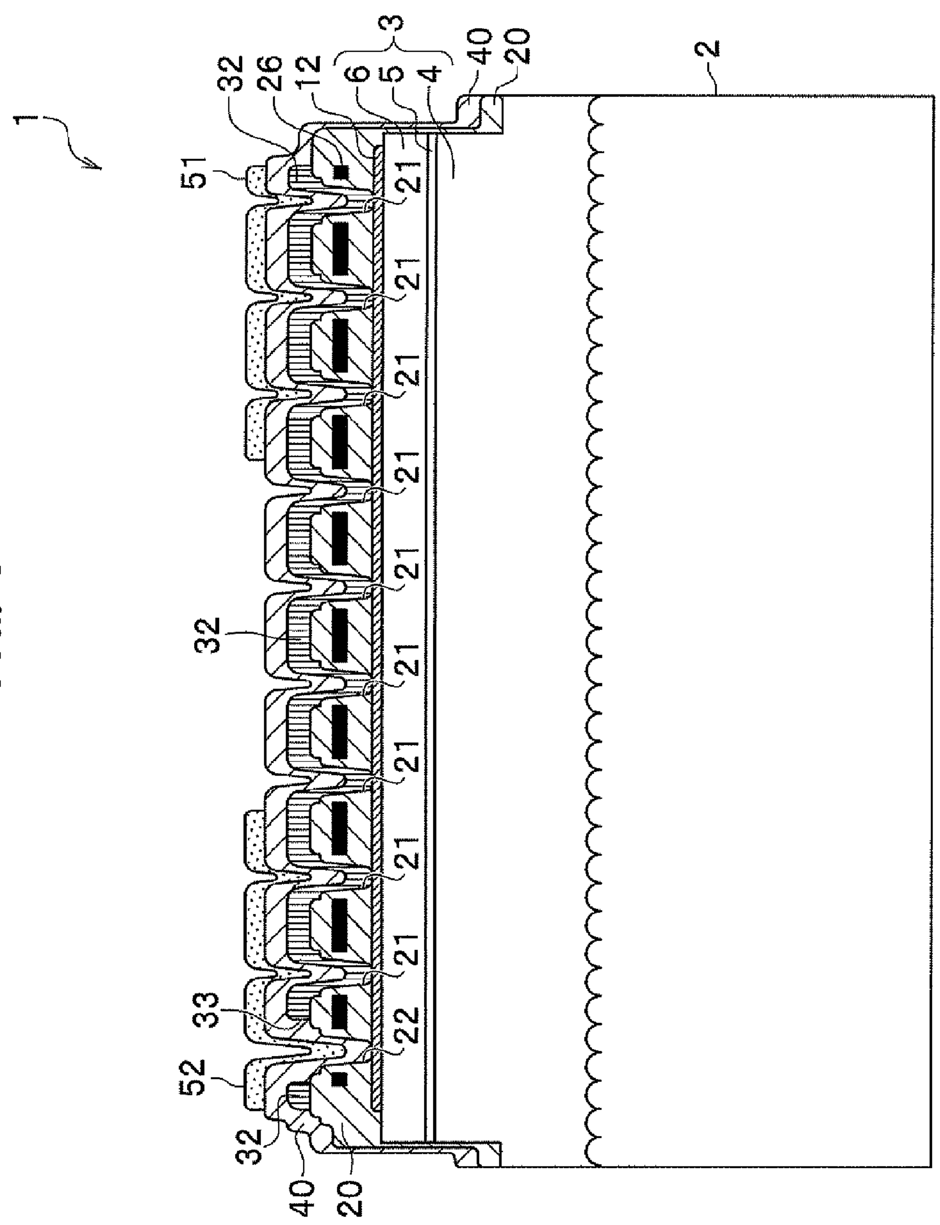
FIG. 6 is a schematic diagram showing a cross section taken along the VI-VI line in FIG. 1.

FIG. 6 is a schematic cross-sectional view taken along the VI-VI line in FIG. 1. As illustrated in FIG. 6, the p-pad electrode 52 and the n-pad electrode 51 is positioned at the mounting surface above the p-type semiconductor layer 6 and have a distance therebetween. The insulation film 20, the p-side electrode layer 32, and the protection film 40 have substantially the same stacking state as illustrated in FIG. 4.

Figure 7:
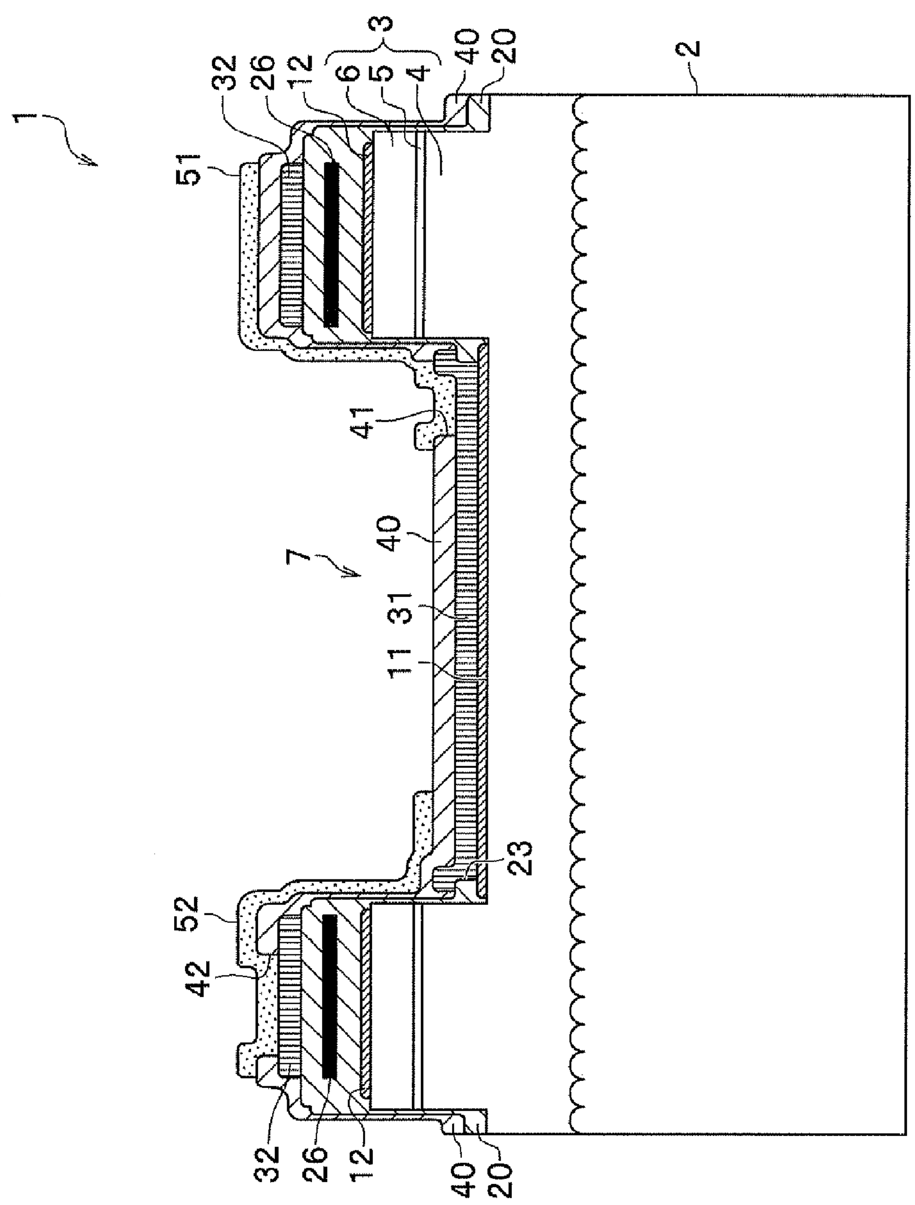
FIG. 7 is a schematic diagram showing a cross section taken along the VII-VII line in FIG. 1.

FIG. 7 is a schematic cross-sectional view taken along the VII-VII line in FIG. 1. As illustrated in FIG. 7, the p-pad electrode 52 and the n-pad electrode 51 have a distance and the concave region 7 is interposed therebetween. The insulation film 20 has substantially the same stacking state over the p-type semiconductor layer 6 and in the periphery of the semiconductor structure 3 as illustrated in FIG. 4. In this regard, however, no second through hole 22 is formed in the VII-VII cross section. Over the p-type semiconductor layer 6, the insulation film 20 is interposed between the transparent conductive film 12 and the p-side electrode layer 32. However, as illustrated in FIG. 4, the insulation film 20 has through holes in order that the p-side electrode layer 32 and the transparent conductive film 12 are made conductive therebetween. Further, part of the inner surface of the concave region 7 is covered with the insulation film 20. Specifically, the insulation film 20 is continuously formed at the side of the semiconductor structure 3, on the upper surface of part of the transparent conductive film 11, and the region which is over the n-type semiconductor layer 4 in the concave region 7, but is not covered with the transparent conductive film 11. In this regard, however, the insulation film 20 has an elongated groove-like third through hole 23 over the transparent conductive film 11 in a longitudinal direction (along the VII-VII line) with respect to the concave region 7. That is, in the concave region 7, the insulation film 20 has a through hole in order that the n-side electrode layer 31 and the transparent conductive film 11 are made conductive therebetween.

As illustrated in FIG. 7, the third through hole 23 has different stacked members depending on their position. For example, at the left position in FIG. 7, there is a region in which the stacked layer includes, in sequence from the n-type semiconductor layer 4 side, the transparent conductive film 11, the n-side electrode layer 31, the protection film 40, and the p-pad electrode 52. In addition, at the right position in FIG. 7, there is a region in which the stacked layer includes, in sequence from the n-type semiconductor layer 4 side, the transparent conductive film 11, the n-side electrode layer 31, and the n-pad electrode 51. In addition, the stacked layer in the region interposed between the above two regions includes, in sequence from the n-type semiconductor layer 4 side, the transparent conductive film 11, the n-side electrode layer 31, and the protection film 40.

As illustrated in FIG. 7, the protection film 40 has substantially the same stacking state over the p-type semiconductor layer 6 and in the periphery of the semiconductor structure 3 as in FIG. 4. Further, part of the inner surface of the concave region 7 is covered with the protection film 40. Specifically, the protection film 40 is disposed over the bottom of the concave region 7 and the insulation film 20 of the inner periphery, and is continuously formed on part of the upper surface of the n-side electrode layer 31 and the region which is not covered with the n-side electrode layer 31. In this regard, however, the protection film 40 has an n-side opening 41 over the n-side electrode layer 31. That is, the protection film 40 has a through hole at the n-side opening 41 in order that the n-pad electrode 51 and the n-side electrode layer 31 are made conductive therebetween. The n-pad electrode 51 extends over the p-type semiconductor layer 6 (at the right side of FIG. 7) from the n-side opening 41. The p-pad electrode 52 extends over the p-type semiconductor layer 6 (at the left side of FIG. 7) and further extends over the bottom of the concave region 7.

Figure 8:
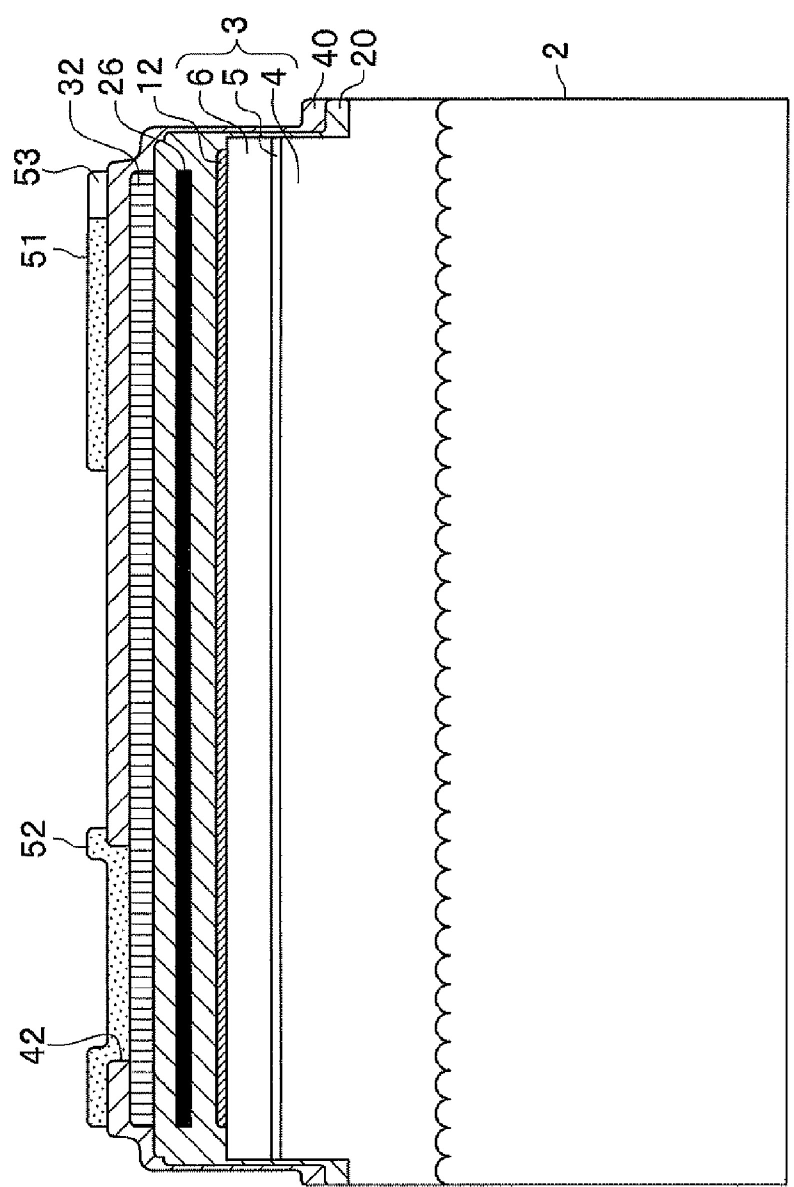
FIG. 8 is a schematic diagram showing a cross section taken along the VIII-VIII line in FIG. 1.

FIG. 8 is a schematic cross-sectional view taken along the VIII-VIII line in FIG. 1. As illustrated in FIG. 8, the p-pad electrode 52 and the n-pad electrode 51 are positioned at the mounting surface above the p-type semiconductor layer 6 and have a distance therebetween. The insulation film 20 is continuously formed over the periphery of the semiconductor structure 3, the transparent conductive film 12, and the region which is over the p-type semiconductor layer 6 but is not covered with the transparent conductive film 12. The p-side electrode layer 32 is continuously distributed above the p-type semiconductor layer 6 and disposed on the insulation film 20. The insulation film 20 is interposed between the transparent conductive film 12 and the p-side electrode layer 32. However, as illustrated in FIG. 4, the insulation film 20 has through holes in order that the p-side electrode layer 32 and the transparent conductive film 12 are made conductive therebetween.

The protection film 40 is continuously formed on the upper surface of the p-side electrode layer 32 and the region which is over the upper surface of the insulation film 20 but is not covered with the p-side electrode layer 32. The protection film 40 has an opening over the p-type semiconductor layer 6. Specifically, the protection film 40 has a through hole at the p-side opening 42 in order that the p-pad electrode 52 and the p-side electrode layer 32 are made conductive therebetween.

The following details each member of the semiconductor light-emitting element 1 shown in FIGS. 1 and 2.

A suitable material when a gallium nitride-based semiconductor, for example, is used for the semiconductor structure 3 can be used for a material of the substrate 2. Examples of such substrate material include sapphire, spinel, SiC, Si, ZnO, and GaN single crystal, etc. Preferred is a sapphire substrate among them so as to productively form easy-to-crystallize gallium nitride. The substrate 2 has roughness on the surface (electrode side surface) on which the semiconductor structure 3 is stacked. This roughness can be used to scatter or diffract light from the semiconductor structure 3 to increase light-extraction efficiency.

The semiconductor structure 3 includes a first semiconductor layer, which is the n-type semiconductor layer 4, and a second semiconductor layer, which is the p-type semiconductor layer 6. One of them or both can be constructed with a plurality of semiconductor layers. In addition, the active layer 5 may be a single layer or a multilayer. Hence, for example, the n-type semiconductor layer 4 and the p-type semiconductor layer 6 may each have a multilayer corresponding to functions necessary for a contact layer, a clad layer, etc. This can help achieve light-emitting properties depending on the need.

Examples of the contact layer for the n-type semiconductor layer 4 include a Si-doped n-type GaN layer. Examples of the clad layer for the n-type semiconductor layer 4 include an Si-doped n-type AlGaN layer.

Examples of the contact layer for the p-type semiconductor layer 6 include an Mg-doped p-type GaN layer. Examples of the clad layer for the p-type semiconductor layer 6 include an Mg-doped p-type AlGaN layer.

Examples of the active layer 5 include an InGaN layer; a single or multiple quantum well layer containing GaN and InGaN; and a single or multiple quantum well layer having an InGaN barrier layer and an InGaN well layer with a composition different from that of the barrier layer.

Note that the n-type semiconductor layer 4 and the p-type semiconductor layer 6 may each include an undoped semiconductor layer. Note that if the n-type semiconductor layer 4, the active layer 5, and the p-type semiconductor layer 6 function as a semiconductor light-emitting element, the p-type semiconductor layer may be employed as the first semiconductor layer and the n-type semiconductor layer may be employed as the second semiconductor layer.

The transparent conductive film 11 is disposed on the n-type semiconductor layer 4 and functions as an ohmic electrode. A thin film made of a metal, an alloy, or a conductive oxide is used to form the transparent conductive film 11. For example, it is possible to use a metal thin film in which Ni and Au are stacked in sequence from the n-type semiconductor layer 4; or a thin film made of an alloy of Ni and Au. In the case of the metal or alloy layer, use of a thin film can keep its translucency.

Examples of the conductive oxide (oxide semiconductor) include a conductive oxide film containing at least one element selected from the group consisting of zinc, indium, tin, gallium, and magnesium. Specific Examples include indium tin oxide (ITO), ZnO, indium zinc oxide (IZO), gallium-doped zinc oxide (GZO), $In_2O_3$, and $SnO_2$, etc. With regard to the conductive oxide, in particular, most preferred is ITO in view of the conductivity and translucency.

The transparent conductive film 12 is disposed on the p-type semiconductor layer 6 and functions as an ohmic electrode. The same material for the transparent conductive film 11 can be used for the transparent conductive film 12. For example, ITO is used to form the transparent conductive film 12.

The ground layer 24 is a ground layer for a DBR 25. The ground layer 24 is made of an insulation film. Particularly preferred is an oxide film. Examples of the oxide film include $Nb_2O_5$, $TiO_2$, $SiO_2$, $Al_2O_3$, and $ZrO_2$, etc. Such insulation film can be produced by known processes including, for example, sputtering, electron cyclotron resonance (ECR)-sputtering, chemical vapor deposition (CVD), ECR-CVD, ECR-plasma CVD, an evaporation method, or electron beam (EB)-vapor deposition, etc.

As illustrated in FIG. 3, the DBR 25 is a multilayer structure in which a plurality of pairs of a low-reflection layer 251 and a high-reflection layer 252 are stacked. The DBR 25 can selectively reflect light with a predetermined wavelength. Specifically, films with a different refractive index and an optical thickness, which is ¼ of the peak wavelength, are alternately stacked, so that the films can highly efficiently reflect the light with the predetermined wavelength. Preferably, examples of the film material include an oxide and nitride containing at least one element selected from the group consisting of Si, Ti, Zr, Nb, Ta, and Al.

When the DBR 25 is produced with an oxide film, $SiO_2$, for example, is used to form the low-reflection layer 251. At this time, for example, $Nb_2O_5$, $TiO_2$, $ZrO_2$, or $Ta_2O_5$, etc, is used to form the high-reflection layer 252. The DBR 25 may include, in sequence form the ground layer 24 side, $(Nb_2O_5/SiO_2)_n$ (provided that n is a natural number). In addition, with regard to DBR 25, the natural number n is preferably from 2 to 5 and more preferably from 3 to 4. Also, the DBR 25 has a total film thickness of preferably from 0.2 to 1 μm and more preferably from 0.3 to 0.6 μm. Note that FIG. 3 depicts the case of n=3 as an example. With regard to the DBR 25, the stacking order of the low-reflection layer 251 and the high-reflection layer 252 may be switched. For example, the DBR 25 may include, in sequence from the ground layer 24 side of the insulation film 20, $(SiO_2/Nb_2O_5)_n$ (provided that n is an natural number).

The metal film 26 is encapsulated in the insulation film 20 and no electricity is supposed to flow therethrough. For example, a metal, such as Al and/or Ag, or alloy with high reflectivity is used to form the metal film 26. When Al is used singly, it is possible to produce a high-output element. When an Al alloy is used, an alloy containing a metal such as Cu, Ag, or a platinum group metal (Pt etc.), for example can be used. Among them, the alloy of Al and Cu (AlCu) can suppress Al migration and can thus produce an element with high reliability. For example, a known process such as sputtering can be used to form such metal film 26. In addition, the metal film 26 may be one with a single layer but may have a multilayer structure in which a material having an effect of tightly attaching to the below-described cap layer 27 and/or an effect of preventing corrosion of Al and Ag is stacked on the metal, such as Al and/or Ag, or alloy with high reflectivity. Examples of the structure can include an Al alloy/Ti double layer structure and an Al alloy/$SiO_2$/Ti triple layer structure. At this time, Ti functions as a layer which mediates the strength of adhesion between the Al alloy and the below-described cap layer 27 or a film which prevents corrosion of Al.

Because the metal film 26 is formed on the DBR 25, it is possible to reflect, light that passes from the semiconductor structure 3 through the DBR 25. Because the light with a given angle of incidence is subject to total reflection, the DBR 25 has an advantage that the reflection results in a little loss. Whereas, when the angle of incidence is large, the reflectivity decreases. In contrast, the metal film 26 has a large degree of the angle of incidence at which light can be reflected. Advantageously, the light that can be reflected has a large wavelength range. A combination between such DBR 25 and metal film 26 makes it possible to efficiently reflect incoming light.

The cap layer 27 is a protection layer covering the metal film 26. The cap layer 27 is made of an oxide film such as $SiO_2$ in the same manner as of the ground layer 24. Note that a material of the cap layer 27 may be the same as of the ground layer 24 or may be different.

Figure 12:
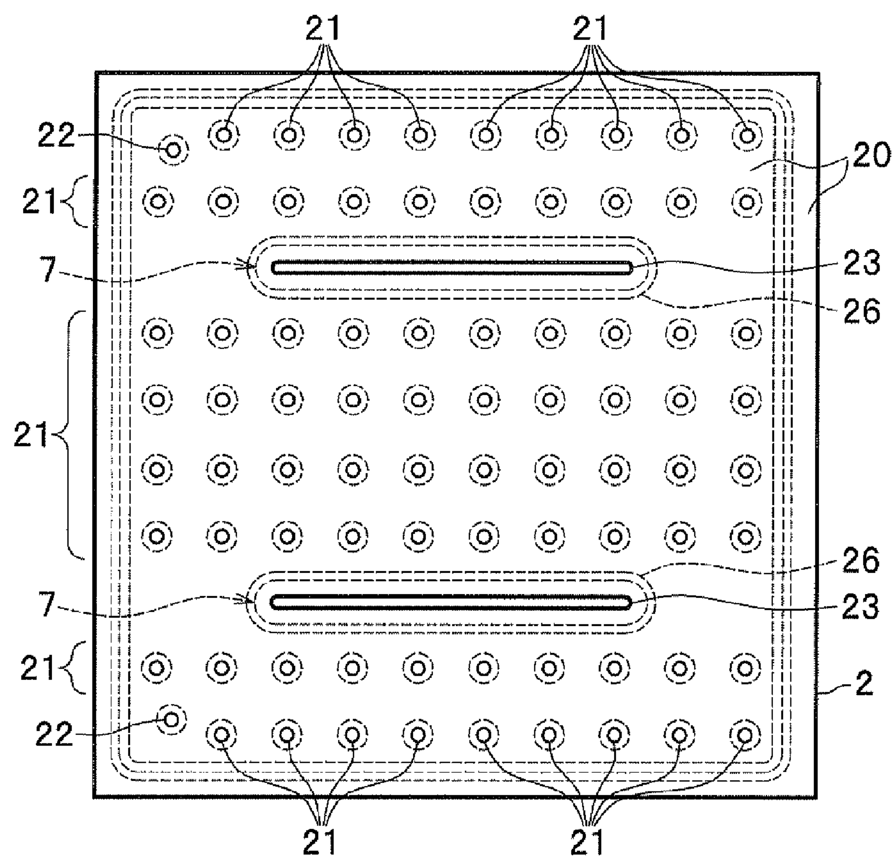
FIG. 12 is a top view (No. 4) illustrating how to manufacture a semiconductor light-emitting element according to the first embodiment.

The insulation film 20 includes first through holes 21, second through holes 22, and third through holes 23 (see FIG. 12). As an example in FIG. 12, through holes in 8 rows and 10 columns are arranged like a grid. Among them, the top left and the bottom left positions are for the two second through holes 22. The rest are for the first through holes 21. The numbers and positions of the first through holes 21 and the second through holes 22 are not limited to the above. The third through hole 23 is a groove along a longitudinal direction with respect to the concave region 7, and is narrower than the bottom of the concave region 7.

The second through holes 22 have an average diameter of a predetermined range. Here, the average diameter means that if the planer shape of the second through hole 22 is not circular, for example, if the shape is ellipsoidal, the average diameter is an average length of the major axis and the minor axis, and if the shape is square, the average diameter is a diameter of a circle having the same area as the square. If this average diameter is less than 5 μm, a resist pattern for etching is deformed, so that it is difficult to produce the second through hole 22. Alternatively, if this average diameter exceeds 15 μm, the second through hole 22 may inhibit current diffusion. Hence, it is preferable that the second through hole 22 has an average diameter of greater than or equal to 5 μm and less than or equal to 15 μm. Note that in the case of the first through hole 21 through which electricity flows, its average diameter is preferably 10 μm or more so as to keep good current characteristics.

The n-side electrode layer 31 is a metal electrode layer disposed between the transparent conductive film 11 and the n-pad electrode 51. A material such as Ti, Rh, Pt, Ru, and/or Au can be used. The stacked layer of the n-side electrode layer 31, for example, includes, in sequence from the transparent conductive film 11 side, Ti, Rh, and Ti. A material for the n-side electrode layer 31 may be any material that enables the ohmic contact with the n-type semiconductor layer 4. Otherwise, another material such as a laminate and alloy which combine other metals can be used. Note that as a modification example, it is possible to cause the n-side electrode layer 31 to directly contact the n-type semiconductor layer 4 without interposing the transparent conductive film 11.

The p-side electrode layer 32 is a metal electrode layer disposed between the transparent conductive film 12 and the p-pad electrode 52. The p-side electrode layer 32 is disposed over the transparent conductive film 12. A material of the p-side electrode layer 32 is the same as of the n-side electrode layer 31. The stacked layer of the p-side electrode layer 32, for example, includes, in sequence from the transparent conductive film 12 side, Ti, Rh, and Ti.

The protection film 40 covers and protects the surface of the semiconductor light-emitting element 1. The protection film 40 is made of an insulation film. Particularly preferred are a nitride film and/or an oxide film. More preferably, the protection film 40 is made of an oxide film. The protection film 40 is made of, for example, $SiO_2$, Zr oxide ($ZrO_2$), SiN, Al oxide ($Al_2O_3$), and/or niobium oxide ($Nb_2O_5$) film. The protection film 40 can be produced using substantially the same process as of the ground layer 24. The protection film 40 may be a single layer or may have a multilayer structure made of the above nitride film and/or oxide film.

Figure 14:
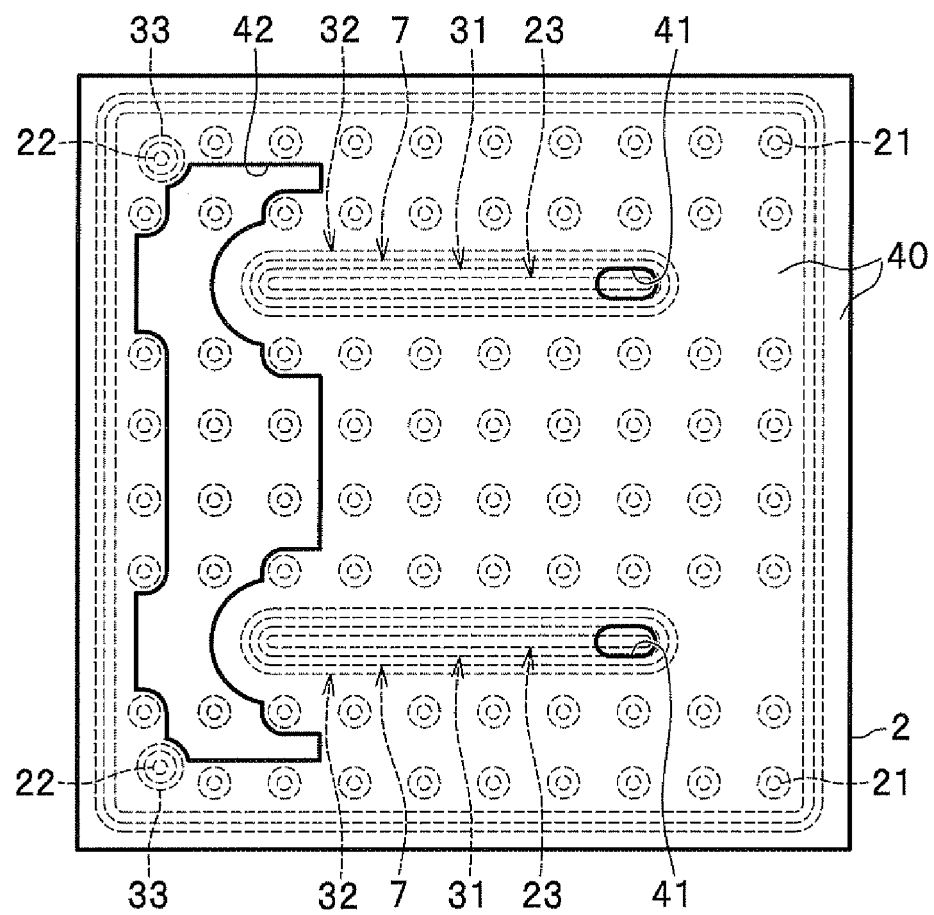
FIG. 14 is a top view (No. 6) illustrating how to manufacture a semiconductor light-emitting element according to the first embodiment.

The protection film 40 has through holes 41 and 42 (see FIGS. 2 and 14). An n-side opening (through hole) 41 of the protection film 40 is made small enough to expose part of the n-side electrode layer 31 disposed over the concave region 7, and the n-side opening 41 is formed at the position under the n-pad electrode 51.

A p-side opening (through hole) 42 of the protection film 40 is disposed near the n-side electrode layer 31 (i.e., the portion close to the center of the element), and the p-side opening 42 is formed at the position under the p-pad electrode 52. Because these openings are formed in such positions, current diffusion cannot be inhibited in the semiconductor structure 3. The p-side opening 42 is made as large as possible in order to reduce resistance. The size of the p-side opening 42 shown in FIG. 14 is an example. Accordingly, the size may be a half or less than that illustrated.

The n-pad electrode 51 is an electrode layer at the outermost surface of the n-side when the semiconductor light-emitting element 1 is mounted. The n-pad electrode 51 is electrically connected to the n-side electrode layer 31. The stacked layer of the n-pad electrode 51, for example, includes, in sequence from the n-side electrode layer 31, Ti, Pt, and Au. Alternatively, the stacked layer of the n-pad electrode 51, for example, includes, in sequence from the n-side electrode layer 31, Ti, Ni, and Au.

The n-pad electrode 51 and the p-pad electrode 52 each have an elongated rectangular shape as shown in FIG. 1. However, a notched portion 53 is formed in the n-pad electrode 51. The notched portion 53 plays a role to mark the cathode (n-side electrode).

The p-pad electrode 52 is an electrode layer at the outermost surface of the p-side when the semiconductor light-emitting element 1 is mounted. The p-pad electrode 52 is electrically connected to the p-side electrode layer 32. The stacked layer of the p-pad electrode 52, for example, includes, in sequence from the p-side electrode layer 32, Ti, Pt, and Au, etc. The p-pad electrode 52 has substantially the same stacking structure as of the n-pad electrode 51.

The following illustrates a method for manufacturing a semiconductor light-emitting element 1 according to an embodiment by referring to FIGS. 9 to 15 (also, by appropriately referring to FIGS. 1 to 3). For actual mass production, a large number of the semiconductor light-emitting elements 1 are arranged like a matrix on a large substrate, which is then cut along dicing lines into individual elements. FIGS. 9 to 15 are schematic top views illustrating how to manufacture the semiconductor light-emitting element 1 according to an embodiment.

Figure 9:
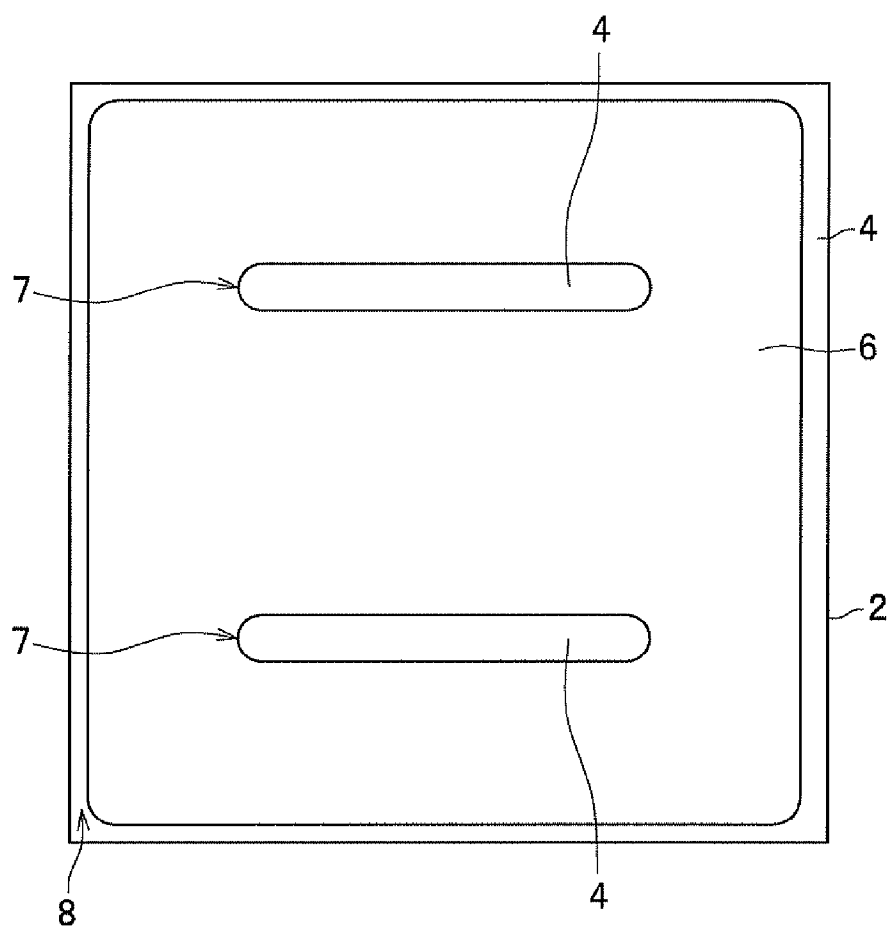
FIG. 9 is a top view (No. 1) illustrating how to manufacture a semiconductor light-emitting element according to the first embodiment.

First, as illustrated in FIG. 2, an n-type semiconductor layer 4, an active layer 5, and a p-type semiconductor layer 6 are stacked on a substrate 2 in this order to produce a semiconductor structure 3. Next, part of the semiconductor structure 3 is etched by, for example, reactive ion etching (RIE) as shown in FIG. 9. At this time, for example, a mask pattern with a shape corresponding to a concave region 7 and a peripheral region 8 is used to carry out etching from the p-type semiconductor layer 6 side so as to expose the surface of the n-type semiconductor layer 4.

Figure 10:
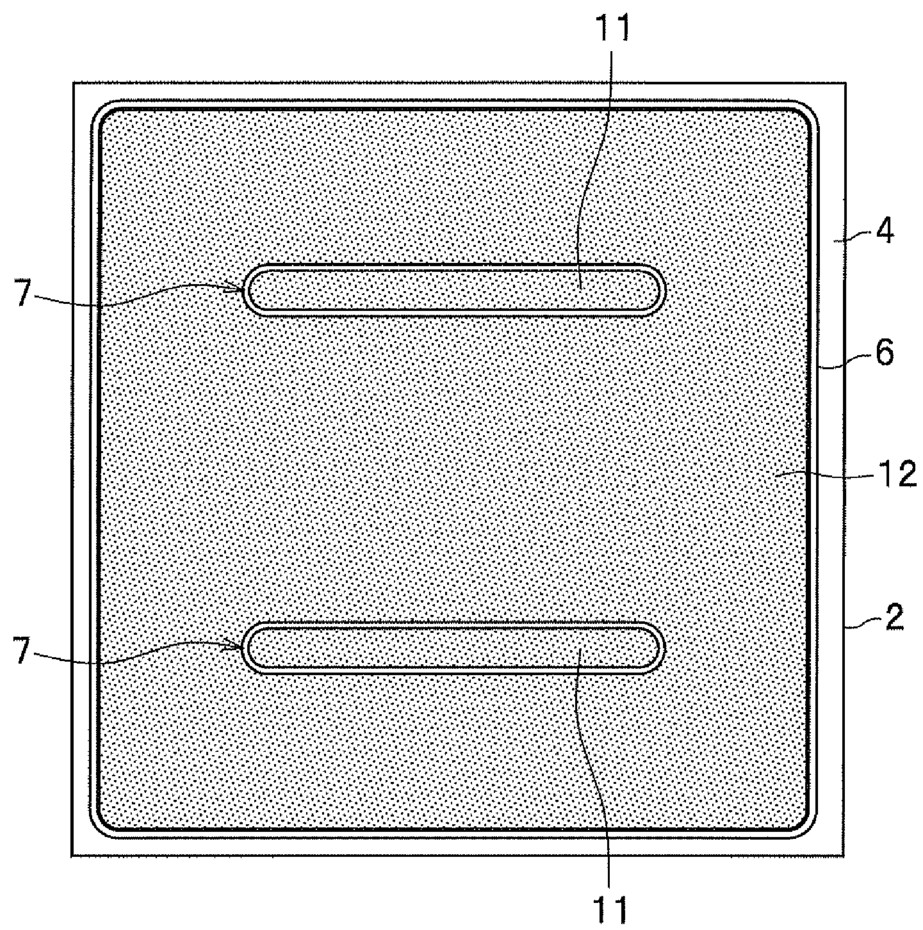
FIG. 10 is a top view (No. 2) illustrating how to manufacture a semiconductor light-emitting element according to the first embodiment.

Then, a transparent electrode material is stacked on the surface of the semiconductor structure 3 by sputtering. By doing so, as illustrated in FIG. 10, in the concave region 7, a transparent conductive film 11 is formed on the n-type semiconductor layer 4 without the p-type semiconductor layer 6, and a transparent conductive film 12 is formed on the p-type semiconductor layer 6.

Figure 11:
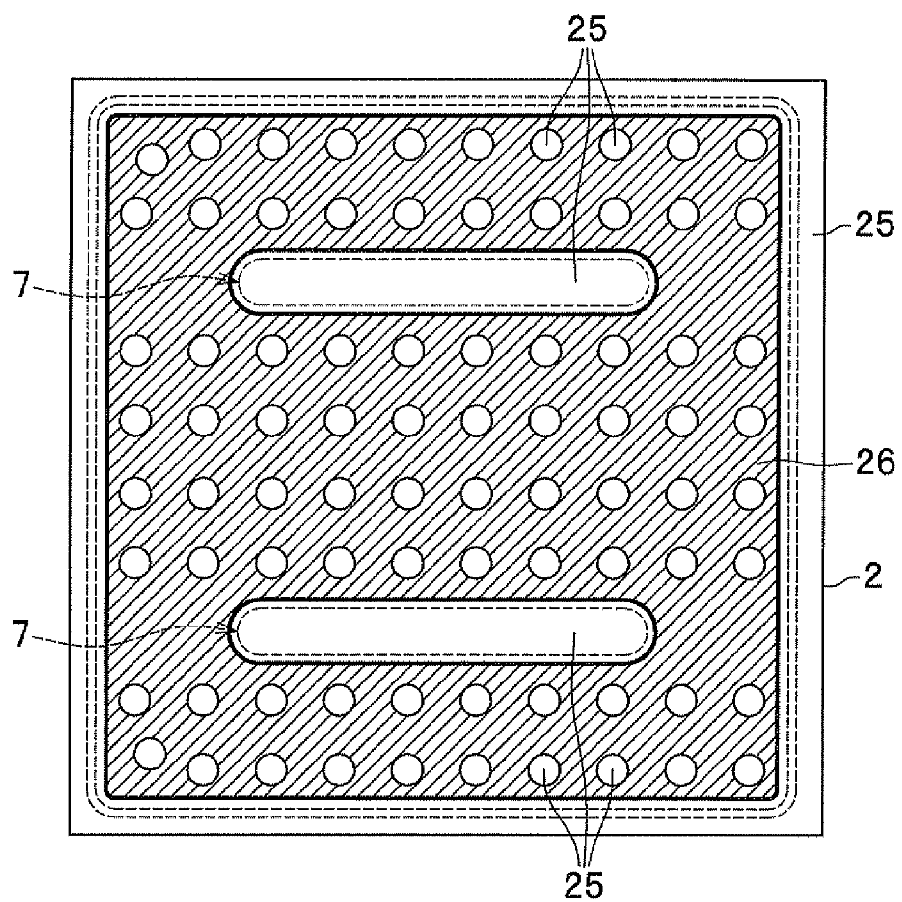
FIG. 11 is a top view (No. 3) illustrating how to manufacture a semiconductor light-emitting element according to the first embodiment.

After that, a ground layer 24 and a DBR 25 (three pairs of a low-reflection layer 251 and a high-reflection layer 252) of an insulation film 20 are formed all over the transparent conductive films 11 and 12 (i.e., over the p-type semiconductor layer 6, the concave region 7, the periphery of the semiconductor structure 3) by sputtering. Subsequently, a metal (e.g., Al) film is deposited on the DBR 25 by sputtering. Thereafter, a metal film 26 having a number of openings is formed by a lift-off process as shown in FIG. 11. Next, a cap layer 27 is formed all over the DBR 25 and the metal film 26.

Then, openings corresponding to first through holes 21 and second through holes 22, and third through holes 23 are created, in the opening regions formed on the metal film 26, by RIE. By doing so, the insulation film 20 having the first through holes 21, the second through holes 22, and the third through holes 23 is formed as illustrated in FIG. 12.

Figure 13:
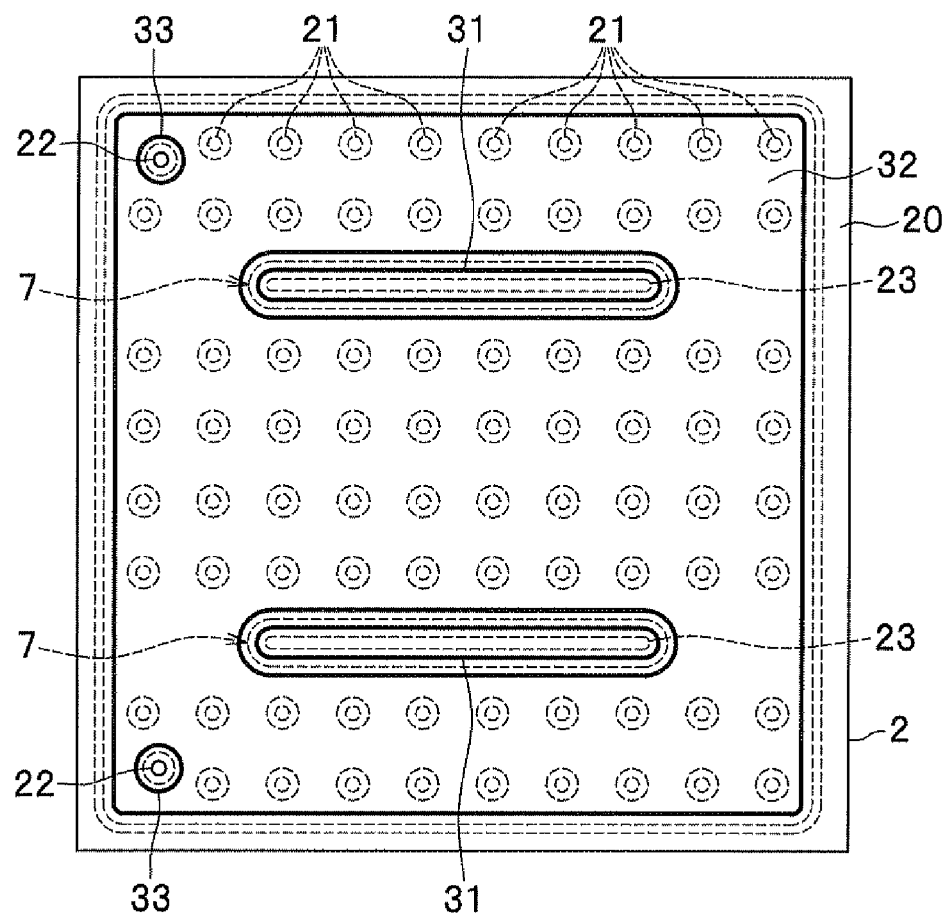
FIG. 13 is a top view (No. 5) illustrating how to manufacture a semiconductor light-emitting element according to the first embodiment.

Subsequently, except for the second through hole 22 region, a film made of electrode material such as Rh is deposited from the insulation film 20 side over the transparent conductive films 11 and 12 by sputtering. By doing so, an n-side electrode layer 31 is formed over the concave region 7 and a p-side electrode layer 32 is formed over the p-type semiconductor layer 6 as shown in FIG. 13. At this time, the second through holes 22 are masked, so that openings for anchor (through holes) 33 are created in the p-side electrode layer 32. In addition, each third through hole 23 of the insulation film 20 is filled with the n-side electrode layer 31, which is stacked on the transparent conductive film 11. Each first through hole 21 of the insulation film 20 is filled with the p-side electrode layer 32, which is stacked on the transparent conductive film 12.

Next, a protection film 40 made of $SiO_2$, etc., is formed all over the n-side electrode layer 31 and the p-side electrode layer 32 (over the p-type semiconductor layer 6, the concave region 7, and the periphery of the semiconductor structure 3) by sputtering. Then, etching is used to remove the protection film 40 from the region containing a plurality of the first through holes 21 at the side of a prospective p-pad electrode 52 (the left side in FIG. 14) next to the concave region 7. By doing so, a p-side opening 42 is created in the protection film 40 as shown in FIG. 14. Likewise, the protection film 40 is removed from the region containing part of the third through hole 23 under a prospective n-pad electrode 51 (the right side in FIG. 14). By doing so, each n-side opening (through-hole) 41 is created. In addition, each opening for anchor (through hole) 33 is filled with the protection film 40. The protection film 40 is stacked through each second through hole 22 on the transparent conductive film 12.

Figure 15:
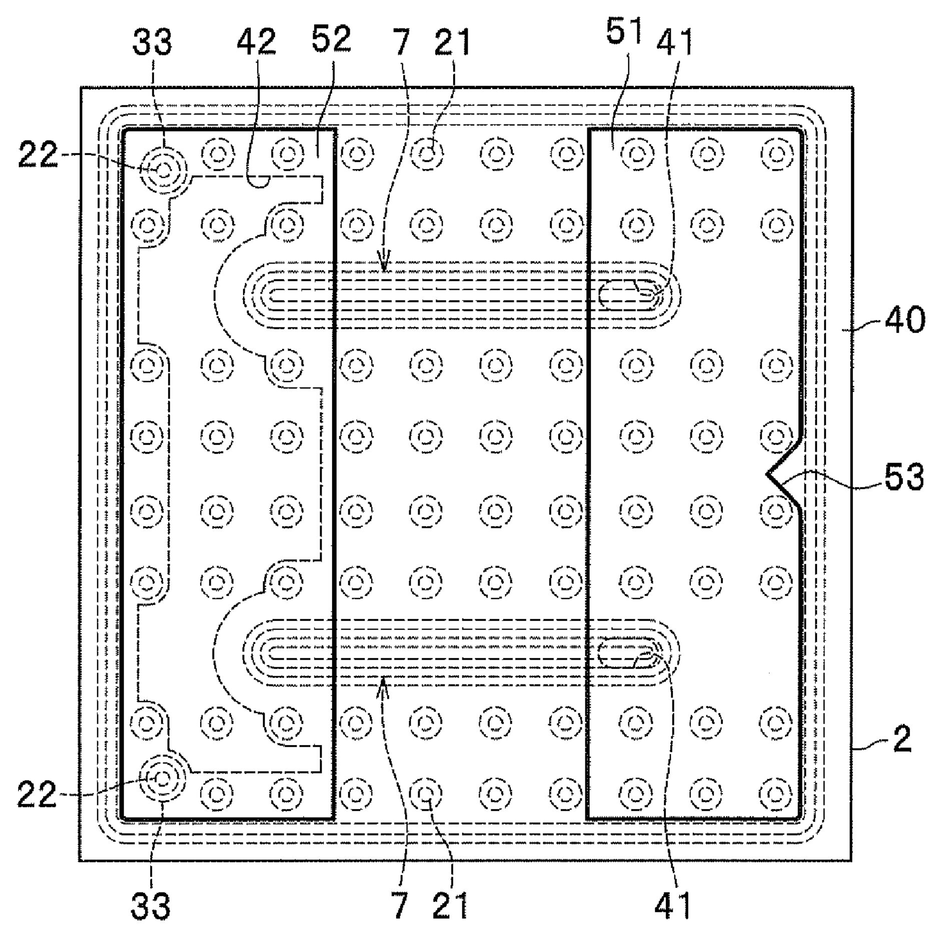
FIG. 15 is a top view (No. 7) illustrating how to manufacture a semiconductor light-emitting element according to the first embodiment.

Subsequently, electrode materials such as Ti, Pt, and Au are deposited on the protection film 40 to form a film by sputtering. A lift-off process is used to produce the n-pad electrode 51 and the p-pad electrode 52 as shown in FIG. 15. After that, the large substrate is cut along dicing lines into individual elements. Note that an alloy is used as an adhesion layer to bond the individual elements directly to or indirectly via a sub-mount substrate to a substrate of a light-emitting apparatus. Thus, the individual elements are used for manufacturing the light-emitting apparatus.

Also, note that specific examples of the material for the adhesion layer can include: In; a Pb—Pd-based alloy; an Au—Ga-based alloy; an Au—(Ge, Si, In, Zn, and/or Sn)-based alloy; an Al—(Zn, Ge, Mg, Si, and/or In)-based alloy; a Cu—(Ge, In, Su, and/or Ag)-based alloy; an Ag—Ge-based alloy; and a Cu—In-based alloy. Preferred is a eutectic alloy film. Examples can include: an alloy using Au and Sn as main components; an alloy using Au and Si as main components; an alloy using Au and Ge as main components; and an alloy using Sn and Cu as main components. Among them, particularly preferred are an AuSn alloy, an SnAgCu alloy, and an SnCu alloy.

According to the semiconductor light-emitting element 1 of the first embodiment, the protection film 40 is tightly attached to the transparent conductive film 12 through the second through hole 22 of the insulation film 20 to function as an anchor member. The transparent conductive film 12 which contacts the protection film 40 through the second through hole 22 prevents the protection film 40 from detaching from the p-side electrode layer 32. Hence, in the semiconductor light-emitting element 1, the above can help increase the strength of adhesion between the p-side electrode layer 32 and the protection film 40.

In addition, in the semiconductor light-emitting element 1 according to the first embodiment, both the n-pad electrode 51 and the p-pad electrode 52 are arranged over the p-type semiconductor layer 6. Accordingly, this structure has a larger contact area during face-down mounting than conventional simple structures, and can therefore improve the strength of adhesion strength, precision, and heat dissipation.

Hereinafter, the second to sixth embodiments are described by referring to FIGS. 16 and 17 (also, by appropriately referring to FIG. 1). FIG. 1 exemplifies the case of the semiconductor light-emitting element 1 having two second through holes 22 under the p-pad electrode 52. Like the following second to fourth embodiments, a second through hole 22 may be disposed under the n-pad electrode 51. In these cases, the protection film 40 is tightly attached through the second through hole 22 to the transparent conductive film 12 to function as an anchor member, so that these embodiments have substantially the same effects as the semiconductor light-emitting element 1 according to the first embodiment.

Figure 16A:
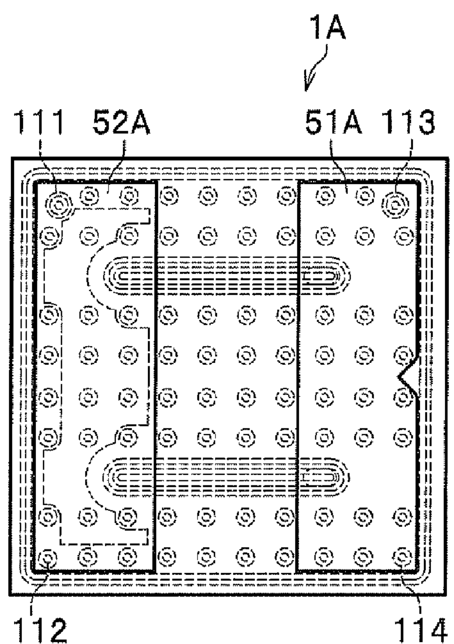
FIGS. 16A to 16D are top views seen from the electrode surface side and show semiconductor light-emitting elements according to second to fifth embodiments.

FIG. 16A is a top view seen from the electrode surface side and shows a semiconductor light-emitting element according to a second embodiment. A semiconductor light-emitting element 1A includes an n-pad electrode 51A and a p-pad electrode 52A at the outermost surface (mounting surface) of the electrode surface side.

Under the p-pad electrode 52A are a non-conductive portion 111 and a conductive portion 112 at corners of the element. A second through hole 22 is created under the non-conductive portion 111. A first through hole 21 is created under the conductive portion 112.

Under the n-pad electrode 51A are a non-conductive portion 113 and a conductive portion 114 at corners of the element. A second through hole 22 is created under the non-conductive portion 113. A first through hole 21 is created under the conductive portion 114.

Specifically, the semiconductor light-emitting element 1A has the two second through holes 22 at the two corners of the upper side of a rectangle when viewed from the electrode surface side.

Figure 16B:
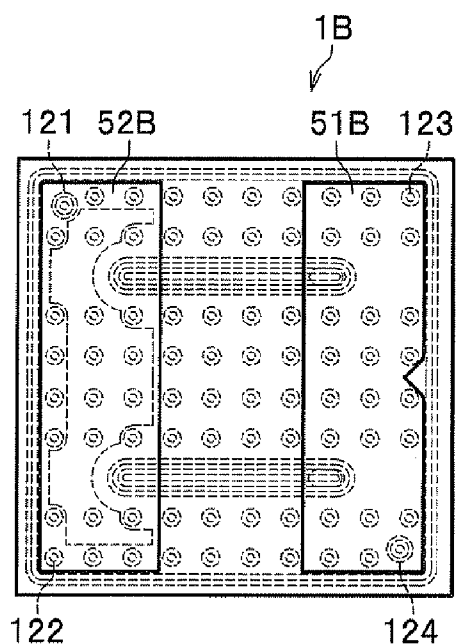

FIG. 16B is a top view seen from the electrode surface side and shows a semiconductor light-emitting element according to a third embodiment. A semiconductor light-emitting element 1B includes an n-pad electrode 51B and a p-pad electrode 52B at the outermost surface (mounting surface) of the electrode surface side.

Under the p-pad electrode 52B are a non-conductive portion 121 and a conductive portion 122 at corners of the element. A second through hole 22 is created under the non-conductive portion 121. A first through hole 21 is created under the conductive portion 122.

Under the n-pad electrode 51B are a conductive portion 123 and a non-conductive portion 124 at corners of the element. A first through hole 21 is created under the conductive portion 123. A second through hole 22 is created under the non-conductive portion 124.

Specifically, the semiconductor light-emitting element 1B has the two second through holes 22 at the opposing corners of a rectangle when viewed from the electrode surface side.

Figure 16C:
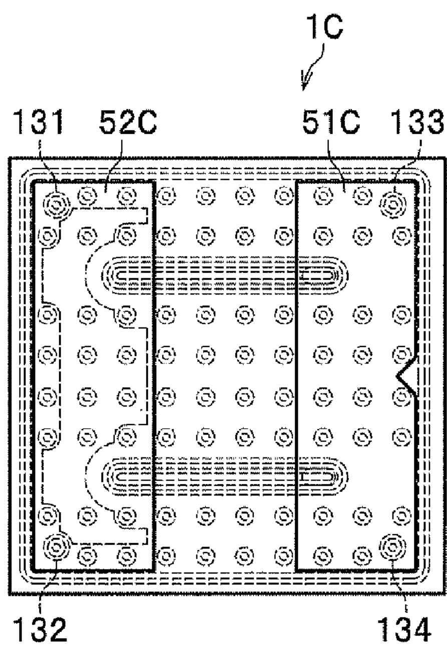

FIG. 16C is a top view seen from the electrode surface side and shows a semiconductor light-emitting element according to a fourth embodiment. A semiconductor light-emitting element 1C includes an n-pad electrode 51C and a p-pad electrode 52C at the outermost surface (mounting surface) of the electrode surface side.

Under the p-pad electrode 52C are two non-conductive portions 131 and 132 at corners of the element. Second through holes 22 are created under the non-conductive portions 131 and 132.

Under the n-pad electrode 51C are two non-conductive portions 133 and 134 at corners of the element. Second through holes 22 are created under the non-conductive portions 133 and 134.

Specifically, the semiconductor light-emitting element 1C has the four second through holes 22, each hole being at each corner of a rectangle when viewed from the electrode surface side.

In the second to fourth embodiments, the second through holes 22 (non-conductive portions) are disposed under both the p-pad electrode 52 and the n-pad electrode 51. The second through hole 22 may be disposed under either pad electrode. In addition, when the second through hole 22 is disposed under either one, it is particularly preferable to dispose it only under the p-pad electrode 52. Under the n-pad electrode 51 is the transparent conductive film 12 that is electrically connected to the p-type semiconductor layer 6. Accordingly, there is a risk of short circuit if defects occur at the protection film 40 of the non-conductive portion. Because of this, it is preferable to dispose the second through hole 22 only under the p-pad electrode 52.

Figure 16D:
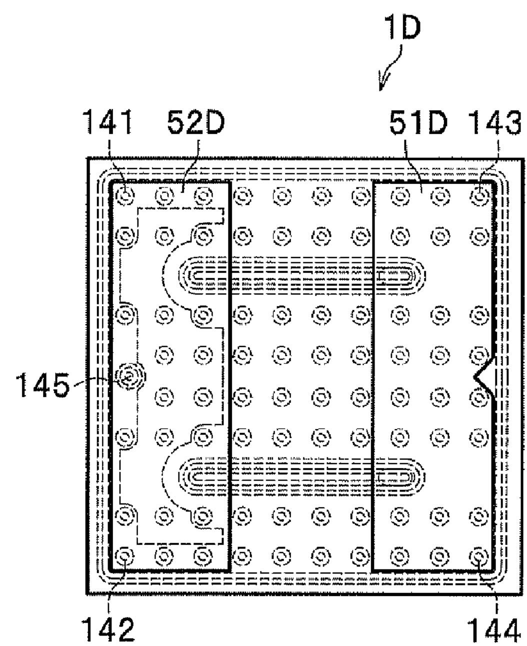

FIG. 16D is a top view seen from the electrode surface side and shows a semiconductor light-emitting element according to a fifth embodiment. A semiconductor light-emitting element 1D includes an n-pad electrode 51D and a p-pad electrode 52D at the outermost surface (mounting surface) of the electrode surface side.

Under the p-pad electrode 52D are two conductive portions 141 and 142 at corners of the element. Under the n-pad electrode 51D are two conductive portions 143 and 144 at corners of the element. First through holes 21 are created under the conductive portions 141 to 144.

A non-conductive portion 145 is positioned between corners and is disposed in the periphery of the element under the p-pad electrode 52D. The non-conductive portion 145 is disposed at an intermediate position between the conductive portions 141 and 142. A second through hole 22 is created under the non-conductive portion 145. That is, the semiconductor light-emitting element 1D has the second through hole 22 at a position between the corners but not at the corners in the periphery of a rectangle when viewed from the electrode surface side.

In the fifth embodiment, the non-conductive portion 145 is positioned at an intermediate position between the conductive portions 141 and 142. The position, however, is not limited to the intermediate position if the position is between the corners in the periphery of the rectangle.

A plurality of the second through holes 22 may be disposed in the periphery of the rectangle. Although the periphery of the rectangle may be at the side of the n-pad electrode 51, it is preferable to dispose the second through hole 22 only at the side of the p-pad electrode 52 because of the above reason. The second through holes 22 may be disposed at the corners and between the corners in the periphery of the rectangle.

The element shape may be circular or polygonal but not rectangular when viewed from the electrode surface side. In that case, the periphery of the element refers to an outline of the circle or the polygon. Then, the second through hole 22 is disposed at a given position inside the outline.

The side edge of the p-type semiconductor layer 6 and the n-type semiconductor layer 4 is positioned between the p-side electrode layer 32 and the n-side electrode layer 31, and tends to have a large current density. Accordingly, the position of the second through hole 22 may not be at corners and/or in the periphery of the element if the position does not substantially affect current diffusion because the position has a distance from the n-type semiconductor layer 4 (concave region 7) without the p-type semiconductor layer 6.

Figure 17:
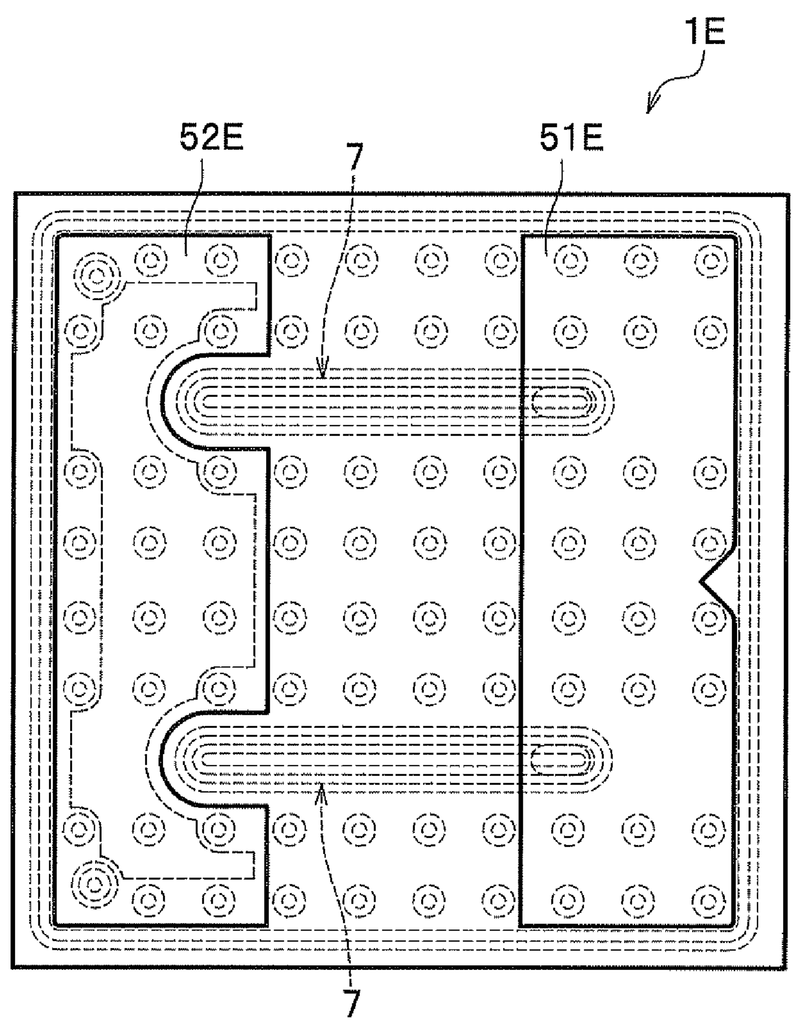
FIG. 17 is a top view seen from the electrode surface side and shows a semiconductor light-emitting element according to a sixth embodiment.

FIG. 17 is a top view seen from the electrode surface side and shows a semiconductor light-emitting element according to a sixth embodiment. As illustrated in FIG. 17, a semiconductor light-emitting element 1E includes an n-pad electrode 51E and a p-pad electrode 52E. The p-pad electrode 52E is formed only over the p-type semiconductor layer 6 but not over the concave region 7. This point differs from the case of the semiconductor light-emitting element 1 shown in FIGS. 1 and 2. In this case, substantially the same effects can be exerted by the semiconductor light-emitting element 1 according to the first embodiment while decreasing an amount of material for the pad electrode.

The above-described embodiments exemplify a semiconductor light-emitting element so as to specify the technical scope of the present invention. The present invention, however, is not limited to the embodiments. In addition, the members disclosed in the Claims attached to the specification of the present application are never restricted to the members of each embodiment. Unless otherwise indicated, the scope of the present invention is not limited to only the size, material, shape, and/or relative position of the components disclosed in each embodiment. These characteristics are just examples for description. Further, with regard to each claim element of the present invention, a plurality of the elements may be defined by the same member, that is, one member may double as a plurality of the elements. Also, functions of one member can be implemented by a plurality of members.

What is claimed is:

1. A semiconductor light-emitting element comprising:
a semiconductor structure having a first semiconductor layer and a second semiconductor layer, the second semiconductor layer being disposed above the first semiconductor layer;
a transparent conductive film disposed on the second semiconductor layer;
an insulation film defining a first through hole and a second through hole, the first through hole and the second through hole exposing the transparent conductive film, the insulation film being disposed on the transparent conductive film;
an electrode disposed on the insulation film and electrically connected to the transparent conductive film through the first through hole; and
a protection film disposed over the insulation film, the protection film contacting with the transparent conductive film through the second through hole, and
wherein the protection film covers part of the electrode.

2. The semiconductor light-emitting element according to claim 1, wherein the second through hole is disposed in a periphery portion of the semiconductor structure.

3. The semiconductor light-emitting element according to claim 1, wherein the second through hole has an average diameter greater than or equal to 5 μm and less than or equal to 15 μm.

4. The semiconductor light-emitting element according to claim 1, further comprising a pad electrode disposed above the second semiconductor layer,
wherein the pad electrode is disposed on the protection film in the second through hole.

5. The semiconductor light-emitting element according to claim 4, wherein the electrode is a second electrode;
the pad electrode is a second pad electrode;
a first electrode is disposed over the first semiconductor layer exposed without the second semiconductor layer; and
a first pad electrode is disposed over the first electrode, the first pad electrode electrically connected to the first electrode, and
wherein the semiconductor structure is covered with the insulation film between the first electrode and the second electrode; and
the first pad electrode extends on the protection film disposed on the second electrode.

6. The semiconductor light-emitting element according to claim 4, wherein the electrode is a second electrode;
the pad electrode is a second pad electrode;
a first electrode is disposed over the first semiconductor layer exposed without the second semiconductor layer; and
a first pad electrode is disposed over the first electrode, the first pad electrode electrically connected to the first electrode, and
wherein the second through hole is disposed only under the second pad electrode.

7. The semiconductor light-emitting element according to claim 1, wherein the insulation film comprises a multilayer film.

8. The semiconductor light-emitting element according to claim 7, wherein the insulation film comprises a metal film embedded inside the multilayer film.

9. A semiconductor light-emitting element comprising:
a semiconductor structure having an n-type semiconductor layer and a p-type semiconductor layer, the p-type semiconductor layer being disposed above the n-type semiconductor layer;
a transparent conductive film disposed on the p-type semiconductor layer;
an insulation film defining a first through hole and a second through hole, the first through hole and the second through hole exposing the transparent conductive film, the insulation film being disposed on the transparent conductive film;
a p-side electrode layer disposed on the insulation film and electrically connected to the transparent conductive film through the first through hole; and
a protection film disposed over the insulation film, the protection film contacting with the transparent conductive film through the second through hole, and
wherein the protection film is disposed over part of the p-side electrode layer.

10. The semiconductor light-emitting element according to claim 9, further comprising a p-pad electrode disposed above the p-type semiconductor layer and is electrically connected to the p-side electrode layer,
wherein the p-pad electrode is disposed on the protection film.

11. The semiconductor light-emitting element according to claim 9, further comprising an n-side electrode layer disposed over the n-type semiconductor layer without the p-type semiconductor layer; and
an n-pad electrode disposed over the n-side electrode layer, the n-pad electrode being electrically connected to the n-side electrode layer;
wherein the semiconductor structure is covered with the insulation film between the n-side electrode layer and the p-side electrode layer; and
the n-pad electrode extends on the protection film disposed on the p-side electrode layer.

12. The semiconductor light-emitting element according to claim 9, further comprising an n-side electrode layer disposed over the n-type semiconductor layer without the p-type semiconductor layer; and
an n-pad electrode over the n-side electrode layer, the n-pad electrode electrically connected to the n-side electrode layer;
wherein the second through hole is disposed under the p-pad electrode.

* * * * *